United States Patent
Gutnik et al.

(10) Patent No.: US 11,067,672 B2
(45) Date of Patent: Jul. 20, 2021

(54) SHARED SAMPLE AND CONVERT CAPACITOR ARCHITECTURE

(71) Applicant: Waymo LLC, Mountain View, CA (US)

(72) Inventors: Vadim Gutnik, Mountain View, CA (US); Andrew Abo, San Carlos, CA (US)

(73) Assignee: Waymo LLC, Mountain View, CA (US)

( * ) Notice: Subject to any disclaimer, the term of this patent is extended or adjusted under 35 U.S.C. 154(b) by 553 days.

(21) Appl. No.: 16/012,579

(22) Filed: Jun. 19, 2018

(65) Prior Publication Data

US 2019/0383916 A1 Dec. 19, 2019

(51) Int. Cl.

| | |
|---|---|
| *G01S 7/486* | (2020.01) |
| *G01S 7/487* | (2006.01) |
| *G01S 17/93* | (2020.01) |
| *G11C 27/02* | (2006.01) |
| *H03M 1/44* | (2006.01) |
| *H03M 1/66* | (2006.01) |
| *G01S 7/4861* | (2020.01) |
| *G01S 7/4865* | (2020.01) |
| *G01S 17/931* | (2020.01) |

(52) U.S. Cl.
CPC ............ *G01S 7/4861* (2013.01); *G01S 7/487* (2013.01); *G01S 7/4865* (2013.01); *G01S 17/931* (2020.01); *G11C 27/028* (2013.01); *H03M 1/442* (2013.01); *H03M 1/662* (2013.01)

(58) Field of Classification Search
CPC ...... G01S 7/4861; G01S 7/4865; G01S 7/487; G01S 17/931; G01S 17/10; H03M 1/662; H03M 1/442; H03M 1/1215; H03M 1/46; G11C 27/028; G11C 27/026
USPC ........................................................ 356/4.07
See application file for complete search history.

(56) References Cited

U.S. PATENT DOCUMENTS

| | | | |
|---|---|---|---|
| 6,587,143 B1 * | 7/2003 | Boisvert | G11C 27/026 348/241 |
| 7,456,812 B2 | 11/2008 | Smith et al. | |
| 7,876,797 B2 | 1/2011 | Sanchez | |
| 8,436,263 B2 | 5/2013 | Kremin | |
| 8,659,694 B2 | 2/2014 | Compton et al. | |
| 9,362,940 B2 * | 6/2016 | Mulder | G11C 27/026 |
| 9,964,632 B1 | 5/2018 | Droz et al. | |
| 2011/0085155 A1 | 4/2011 | Stann et al. | |
| 2014/0140652 A1 | 5/2014 | Aflatouni et al. | |

(Continued)

OTHER PUBLICATIONS

Written Opinion and International Search Report for PCT Application No. PCT/US2019/033689, dated Sep. 19, 2019, 9 pages.

*Primary Examiner* — Daniel L Murphy
(74) *Attorney, Agent, or Firm* — McDonnell Boehnen Hulbert & Berghoff LLP

(57) ABSTRACT

A LIDAR device includes an input node, an output node, and a sample-and-convert circuit. The input node receives a photodetector signal, and the output node generates an output signal indicating a light intensity value of the photodetector signal. The sample-and-convert circuit includes a number of detection channels coupled in parallel between the input node and the output node. In some aspects, each of the detection channels may be configured to sample a value of the photodetector signal during the sample mode and to hold the sampled value during the convert mode using a single capacitor.

20 Claims, 9 Drawing Sheets

(56) References Cited

U.S. PATENT DOCUMENTS

| | | |
|---|---|---|
| 2015/0099309 A1 | 4/2015 | Krufka |
| 2015/0116695 A1 | 4/2015 | Bartolome et al. |
| 2017/0031009 A1 | 2/2017 | Davidovic et al. |
| 2018/0019020 A1 | 1/2018 | Vilas Boas et al. |
| 2018/0089490 A1 | 3/2018 | Liang |
| 2018/0098003 A1 | 4/2018 | Matolin et al. |

* cited by examiner

SHARED SAMPLE AND CONVERT CAPACITOR ARCHITECTURE

TECHNICAL FIELD

This disclosure relates generally to LIDAR devices, and specifically to determining intensity levels of reflected light received by LIDAR devices.

DESCRIPTION OF THE RELATED TECHNOLOGY

Vehicles can be configured to operate in an autonomous mode in which the vehicle navigates through an environment with little or no input from a driver. These autonomous vehicles typically include one or more sensors configured to determine information about the environment in which the vehicle operates. For example, autonomous vehicles may include one or more light detection and ranging (LIDAR) devices to detect objects (e.g., other vehicles, pedestrians, traffic signals, obstacles, and so on) in the environment.

A LIDAR device can estimate distances to a number of environmental features while scanning through a scene to generate a point cloud of reflective surfaces in the environment. Individual points in the point cloud can be determined by transmitting a light pulse and detecting a returning light pulse, if any, reflected from an object in the environment. The distance between the LIDAR device and the object may be determined using the time delay between the transmitted light pulse and the reception of the reflected light pulse. A number of lasers can be rapidly scanned across a scene to provide continuous real-time information of the distances between the LIDAR device and detected objects. The measured distances can be combined with orientations of the lasers to associate a three-dimensional position with each light pulse received by the LIDAR device. The three-dimensional positions associated with a number of received light pulses may be used to generate a three-dimensional map of points indicative of locations of reflective features in the environment.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

One innovative aspect of the subject matter described in this disclosure can be implemented in a LIDAR detector. The LIDAR detector may include an input node to receive a photodetector signal, an output node to generate an output signal indicating a light intensity value of the photodetector signal, and a sample-and-convert circuit including a number of detection channels coupled in parallel with each other between the input node and the output node. Each of the detection channels may include a single capacitor and a comparator connected in series between the input node and the output node, may include a first switch configured to selectively couple a first plate of the single capacitor to the photodetector signal, and a second switch configured to selectively couple a second plate of the single capacitor to a supply voltage. In some implementations, the single capacitor may be configured to capture the value of the photodetector signal during a sample mode and to hold the captured value as a differential voltage across the single capacitor during a convert mode, and the comparator may be configured to generate a compare signal based on a comparison between the captured value and a reference value. In some aspects, the differential voltage remains constant irrespective of voltage changes on either plate of the single capacitor.

The LIDAR detector may also include a first circuit configured to generate a digital code word based at least in part on the compare signal, and a second circuit configured to convert the digital code word into an analog value. The comparator may be further configured to determine whether the analog value is greater than the captured value. The first circuit may be a digital logic circuit configured to iteratively adjust the digital code word until the analog value equals the captured value. In addition, or in the alternative, the digital logic circuit may be configured to identify a value of the digital code word that is closest to the differential voltage. In some implementations, the identified digital code word may be provided as an indication of the captured value of the photodetector signal.

Another innovative aspect of the subject matter described in this disclosure can be implemented in a LIDAR device. The LIDAR device may include an input node, an output node, and a sample-and-convert circuit. The input node may receive a photodetector signal, and the output node may generate an output signal indicating a light intensity value of the photodetector signal. The sample-and-convert circuit may include a number of detection channels coupled in parallel with each other between the input node and the output node. Each of the detection channels may be configured to sample a value of the photodetector signal during a sample mode and to hold the sampled value during a convert mode using a single capacitor. In some aspects, the sampled value may be a differential voltage across the single capacitor that remains constant irrespective of voltage changes on a plate of the capacitor.

In some implementations, each of the detection channels may include a first switch configured to selectively couple a first plate of the single capacitor to receive the photodetector signal, a second switch configured to selectively couple a second plate of the single capacitor to a supply voltage, and a third switch configured to selectively couple the first plate of the single capacitor to the supply voltage. During a first portion of the sample mode, the second and third switches may be configured to enable the single capacitor to store a differential voltage indicative of the sampled value, and during a second portion of the sample mode, the second and third switches may be configured to move a reference point of the differential voltage from the first plate to the second plate. In some aspects, the first switch may be configured to route the photodetector signal to the single capacitor during the first portion of the sample mode, and may be configured to isolate the single capacitor from the photodetector signal during the second portion of the sample mode.

In some implementations, each of the detection channels may also include a comparator coupled between the single capacitor and the output node, and the comparator may be configured to generate a compare signal based on a comparison between the sampled value and a reference value. In some aspects, the LIDAR device may also include a first circuit configured to select a digital code word based at least in part on the compare signal, and a second circuit configured to drive the single capacitor to with a selected voltage based on the digital code word. The comparator may be further configured to determine whether the selected voltage is greater than the sampled value. In some aspects, the first circuit may be a digital logic circuit configured to identify a value of the digital code word that is closest to the differential voltage.

Another innovative aspect of the subject matter described in this disclosure can be implemented as a method. The method can include providing the photodetector signal to a single capacitor having first and second plates; capturing a value of the photodetector signal as a differential voltage across the single capacitor by coupling the first plate of the single capacitor to the photodetector signal and coupling the second plate of the single capacitor to a supply voltage; holding the differential voltage across the single capacitor by isolating the first and second plates from the supply voltage; selecting a digital code word based, at least in part, on a comparison between the differential voltage and a reference voltage; identifying a value of the digital code word closest to a transition point of the comparison; and selecting the identified digital code word as an indication of the captured value. In some implementations, the method may also include moving a reference point of the differential voltage by coupling the first plate to the supply voltage and isolating the second plate from the supply voltage. In addition, or in the alternative, the method may include maintaining a constant value of the differential voltage across the single capacitor irrespective of voltage changes on either plate of the single capacitor.

In some implementations, the single capacitor may be configured to sample a value of photodetector signal during a sample mode and to hold the sampled value during a convert mode. In some aspects, a first switch may be configured to route the photodetector signal to the single capacitor during a first portion of the sample mode, and may be configured to isolate the single capacitor from the photodetector signal during a second portion of the sample mode. In addition, or in the alternative, second and third switches may be configured to enable the single capacitor to store the differential voltage during the first portion of the sample mode, and may be configured to move a reference point of the differential voltage from the first plate to the second plate of the single capacitor during the second portion of the sample mode.

Details of one or more implementations of the subject matter described in this disclosure are set forth in the accompanying drawings and the description below. Other features, aspects, and advantages will become apparent from the description, the drawings and the claims. Note that the relative dimensions of the following figures may not be drawn to scale.

BRIEF DESCRIPTION OF THE DRAWINGS

Like reference numbers and designations in the various drawings indicate like elements.

DETAILED DESCRIPTION

The following description is directed to certain implementations for the purposes of describing the innovative aspects of this disclosure. However, a person having ordinary skill in the art will readily recognize that the teachings herein can be applied in a multitude of different ways. The described implementations may be implemented in any device, system, or vehicle that is capable of sampling signals to determine or derive information contained in the signals.

Implementations of the subject matter described herein may allow a LIDAR receiver to sample a value of a photodetector signal and to hold the sampled value using a single capacitor, which may decrease circuit area and reduce noise, for example, compared with detectors that use one set of capacitors to sample data and use another set of capacitors to hold the captured data for conversion to digital data.

As used herein, the term "asserted" may refer to driving a signal to a first logic state that causes a corresponding switch to close (or to remain closed), and the term "de-asserted" may refer to driving a signal to a second logic state that causes a corresponding switch to open (or to remain opened). In some aspects, the first logic state may correspond to a logic high state, and the second logic state may correspond to a logic low state. In other aspects, the first logic state may correspond to a logic low state, and the second logic state may correspond to a logic high state. The term "coupled" as used herein means coupled directly to or coupled through one or more intervening components or circuits.

In the following description, numerous specific details are set forth such as examples of specific components, circuits, and processes to provide a thorough understanding of the present disclosure. Also, in the following description and for purposes of explanation, specific nomenclature and/or details are set forth to provide a thorough understanding of the example embodiments. However, it will be apparent to one skilled in the art that these specific details may not be required to practice the example embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components.

Figure 1:
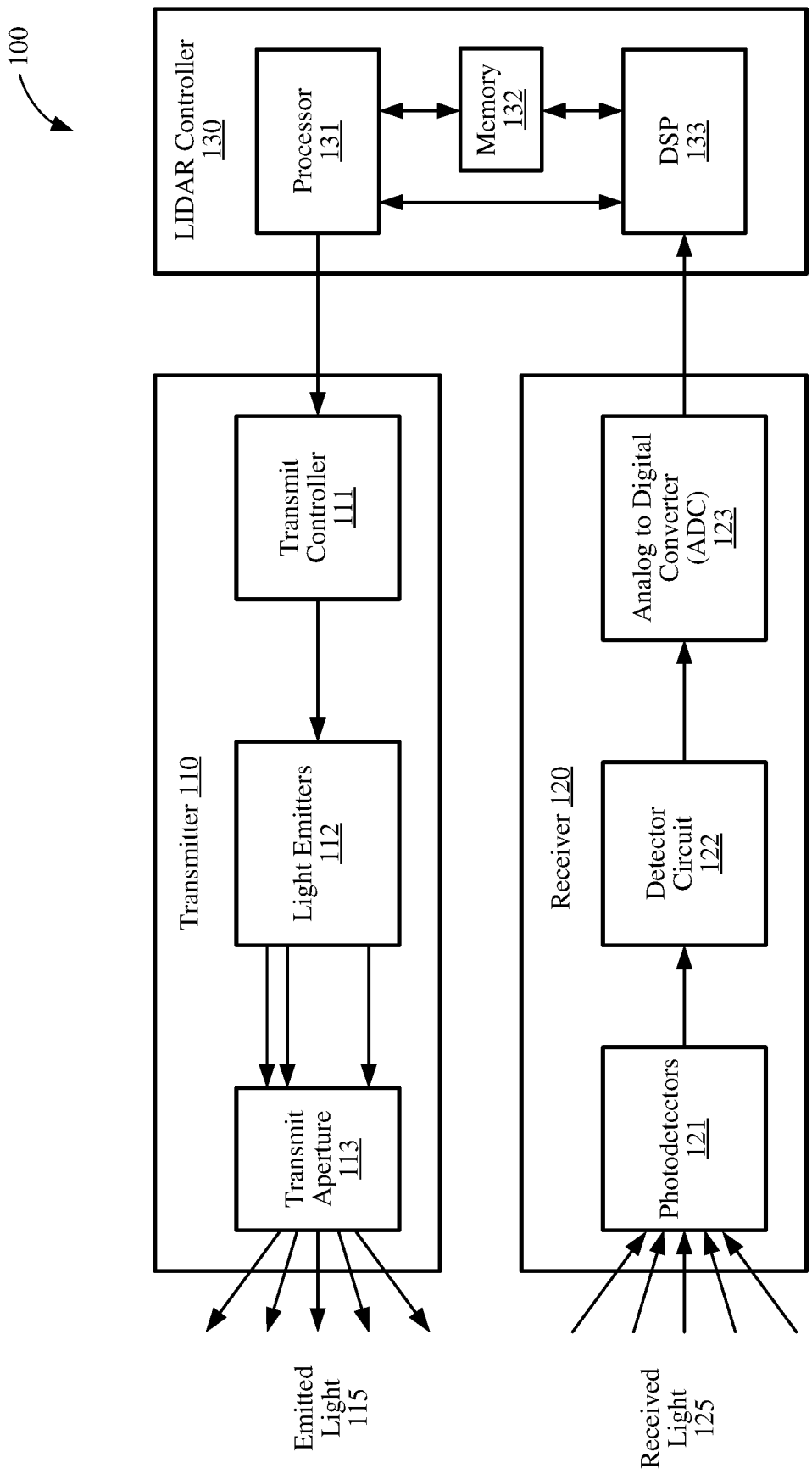
FIG. 1 is a block diagram of an example LIDAR device.

FIG. 1 is a block diagram of an example light detection and ranging (LIDAR) device 100. The LIDAR device 100 may be used to detect points or objects in an environment by emitting pulses of light that illuminate the points or objects and detecting light pulses reflected from the points or objects. The LIDAR device 100 can determine the distance to a selected object based on the time delay between the emission of a light pulse and the reception of a corresponding light pulse reflected from the selected object. This time delay, which may also be referred to as the "time-of-flight" or the round-trip time of the light pulse, may be multiplied by the speed of light to determine the distance between the LIDAR device 100 and the selected object. Distance information of a number of points associated with the selected object may be used to determine the location, size, shape, pose, and motion of the selected object. The LIDAR device 100 may scan its surrounding environment and use distance information to generate a map of the environment. In some implementations, the LIDAR device 100 may be used to control an autonomous vehicle, for example, so that the autonomous vehicle can navigate the environment to reach a destination while avoiding obstacles.

The LIDAR device 100 is shown to include a transmitter 110, a receiver 120, and a LIDAR controller 130. The transmitter 110 may include a transmit controller 111, a number of light emitters 112, and a transmit aperture 113. The light emitters 112 may emit one or more light pulses 125 that can be used to detect objects in a surrounding environment. The light emitters 112 may include any number of suitable light sources such as (but not limited to) laser diodes, light emitting diodes (LEDs), vertical cavity surface emitting lasers (VCSEL), organic light emitting diodes (OLEDs), polymer light emitting diodes (PLED), light emitting polymers (LEP), liquid crystal displays (LCD), microelectromechanical systems (MEMS), or any other device configured to selectively transmit or emit light pulses 125 at a source wavelength. The source wavelength may include, for example, the ultraviolet, visible, and/or infrared portions of the electromagnetic spectrum. In some aspects, the light emitters 112 may be disposed on one or more substrates (e.g., printed circuit boards (PCB), flexible PCBs, and the like). Although the light emitters 112 are described herein as emitting light pulses 115, one of ordinary skill in the art will readily understand that the light emitters 112 may transmit or emit light signals, light beams, photons, and the like. Thus, the terms light pulses, light signals, light beams, and photons may be used interchangeably herein.

The transmit aperture 113 is coupled to the light emitters 112, and may include any suitable components (e.g., mirrors, lenses, diffraction gratings, exit apertures, and the like) that can focus, direct, and/or condition the light pulses 115 for emission into the surrounding environment. In some implementations, the transmit aperture 113 may be configured to steer the light pulses 115 in one or more specified directions relative to the LIDAR device 100. The specified directions may span a range of directions, for example, so that distances between the LIDAR device 100 and a number of objects (e.g., cars, people, roads, traffic signals, traffic signs, obstacles, and so on) may be determined based on reflections of the light pulses 115 caused by the objects.

The transmit controller 111 may control operations of the light emitters 112 and the transmit aperture 113, may adjust a number of parameters or settings of the light emitters 112 and the transmit aperture 113, or both. In some implementations, the transmit controller 111 may be responsive to one or more control signals provided by the LIDAR controller 130. For example, the transmit controller 111 may adjust the pulse width of the light pulses 115 emitted by the light emitters 112 based on the one or more control signals. In other implementations, the transmit controller 111 may be omitted or may be included within the LIDAR controller 130.

The receiver 120 may include a number of photodetectors 121, a detector circuit 122, and an analog-to-digital converter (ADC) 123. The photodetectors 121 may receive light pulses 125 (e.g., photons) from the surrounding environment. In some implementations, the received light pulses 125 may include components of the emitted light pulses 115 reflected from one or more objects in the surrounding environment. The photodetectors 121 may be configured to convert the received light pulses 125 into photodetector signals (e.g., analog current signals) indicative of intensity levels of the received light pulses 125. The photodetectors 121 may be any suitable component or device that can receive or sense light including, for example, photodiodes, avalanche photodiodes, Silicon Photomultipliers (SiPMs), phototransistors, cameras, active pixel sensors (APS), charge coupled devices (CCD), cryogenic detectors, or the like. In some implementations, the photodetectors 121 are reverse-biased photodiodes that generate a current in response to receiving light pulses, for example, such that the amount of current through each photodiode is proportional to the intensity of light pulses received by the photodiode.

Although not shown for simplicity, the receiver 120 may include optics to filter wavelengths of the received light so that the photodetectors 121 primarily receive light corresponding to the wavelength of the light pulses 115 emitted by the transmitter 110 (and receive minimal light corresponding to other wavelengths).

The detector circuit 122 may use any suitable technique to sample photodetector signals provided by the photodetectors 121 to determine intensity levels of the received light pulses 125. In some implementations, the detector circuit 122 may sample the photodetector signals at a number of intervals or sampling times. In other implementations, the detector circuit 122 may continuously sample the photodetector signals. The detector circuit 122 may provide the determined intensity levels to the ADC 123, for example, as analog signals having a magnitude (e.g., a voltage magnitude or a current magnitude) indicative of light information contained in the photodetector signals. In some aspects, the detector circuit 122 may amplify and/or filter the photodetector signals.

The ADC 123 may receive analog signals indicating intensity levels of the received light pulses 125 from the detector circuit 122, and may convert the analog signals into digital data that can be processed by the LIDAR controller 130. The ADC 123 may be any suitable ADC such as (but not limited to) a flash ADC, a successive-approximation-register (SAR) ADC, or a delta-sigma ADC. In some implementations, each photodetector 121 may correspond to a respective ADC. In other implementations, a plurality of photodetectors 121 may correspond to a single ADC (e.g., to reduce the size, cost, and/or power consumption of the LIDAR device 100). In some other implementations, the ADC 123 may be omitted.

The LIDAR controller 130 may include a processor 131, a memory 132, and a digital signal processor (DSP) 133. The DSP 133 may process digital data provided by the ADC 123 to determine intensity information of light pulses received by any number of the photodetectors 121. In some implementations, the determined intensity information may be used to determine the size, shape, and location of a number of detected objects in the surrounding environment. Objects that are relatively close to the LIDAR device 100 may reflect emitted light pulses 115 before objects that are relatively far from the LIDAR device 100. In addition, light reflected from objects that are relatively close to the LIDAR device 100 may have less pulse spreading than light reflected from objects that are relatively far from the LIDAR device 100. Thus, in some implementations, the distance between LIDAR device 100 and an object may be estimated based on the rising and falling edges of the received light pulses 125.

The processor 131 may be any suitable one or more processors capable of executing scripts or instructions of one or more software programs stored in the LIDAR device 100 (e.g., within the memory 132). In some implementations, the processor 131 may include one or more microprocessors and memory providing at least a portion of machine-readable media within which program instructions or scripts can be stored. In other implementations, the processor 131 may be an Application Specific Integrated Circuit (ASIC). In some other implementations, the processor 131 may be or include one or more Field Programmable Gate Arrays (FPGAs) or Programmable Logic Devices (PLDs).

The memory 132 may store information pertaining to the transmitter 110, the receiver 120, the surrounding environment, or any combination thereof. The memory 132 may also include a non-transitory computer-readable medium (e.g., one or more nonvolatile memory elements, such as EPROM, EEPROM, Flash memory, a hard drive, and so on) that may store a number of software (SW) modules each including instructions that, when executed by the processor 131, causes the LIDAR device 100 to perform all or a portion of the operations described with respect to FIG. 9.

Figure 2A:
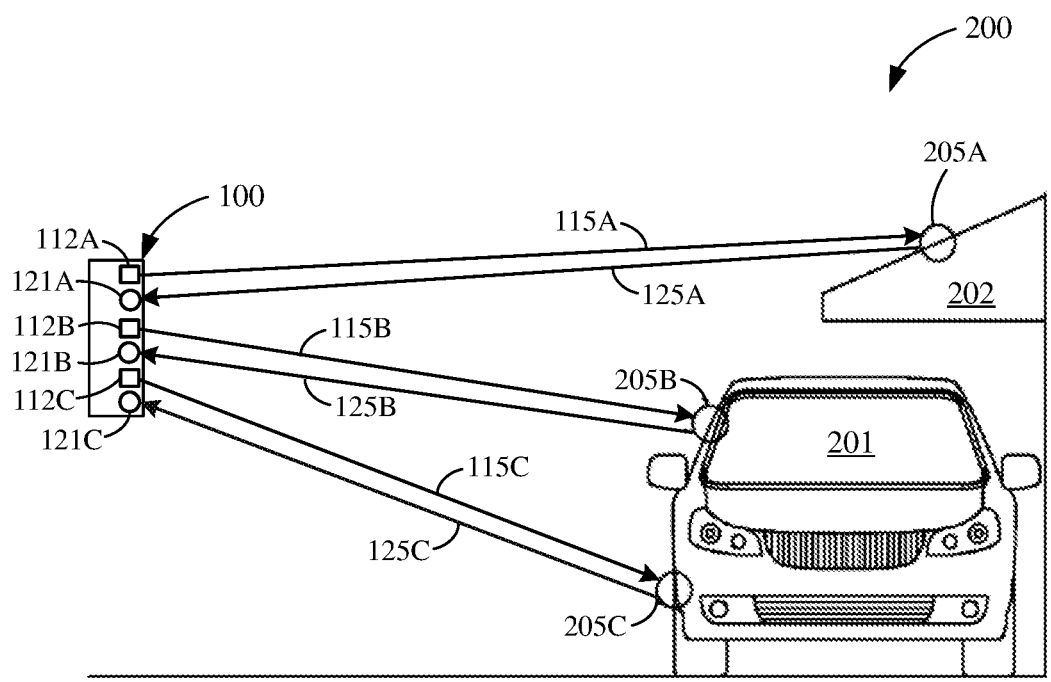
FIG. 2A illustrates a LIDAR device in an environment.

FIG. 2A illustrates a LIDAR device in an environment. In the example of FIG. 2A, the LIDAR device 100 is situated in an environment 200 including an automobile 201 and an overhang 202. The LIDAR device 100 is shown to include three light emitters 112A-112C that emit respective light pulses 115A-115C into the environment 200, and to include three photodetectors 121A-121C that receive respective light pulses 125A-125C reflected from objects in the environment 200. A first light pulse 115A illuminates a portion 205A of the overhang 202, and a first photodetector 121A receives a corresponding reflected light pulse 125A. A second light pulse 115B illuminates a portion 205B of the automobile 201, and a second photodetector 121B receives a corresponding reflected light pulse 125B. A third light pulse 115C illuminates another portion 205C of the automobile 201, and a third photodetector 121C receives a corresponding reflected light pulse 125C. The LIDAR device 100 may use one or more properties of the received light pulses 125A-125C (e.g., timing, amplitude, pulse width, and so on) to determine the distance between the LIDAR device 100 and each of the portions 205A-205C in the environment 200.

Figure 2B:
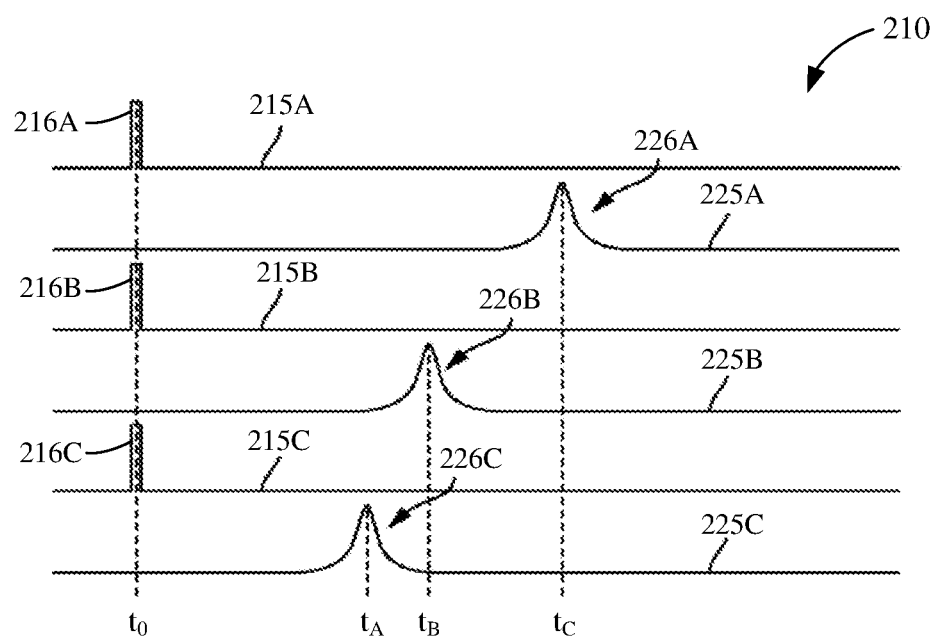
FIG. 2B is a timing diagram of waveforms corresponding to emitted light pulses and received light pulses of a LIDAR device.

FIG. 2B is an example timing diagram 210 of waveforms corresponding to emitted light pulses and received light pulses of a LIDAR device. Transmit waveforms 215A-215C may be indicative of intensity levels of respective light pulses 115A-115C emitted from the LIDAR device 100 of FIG. 2A, and receive waveforms 225A-225C may be indicative of intensity levels of respective light pulses 125A-125C received by the LIDAR device 100 of FIG. 2A. The light pulses 115A-115C are emitted from the LIDAR device 100 at the same time to (or at least substantially the same time), and the reflected light pulses 125A-125C are received by the LIDAR device 100 at different times $t_A$-$t_C$ (e.g., due to different distances between the LIDAR device 100 and each of the portions 205A-205C of the environment 200). The transmit waveforms 215A-215C include respective pulses 216A-216C that represent the time to at which corresponding light pulses 115A-115C are emitted from the LIDAR device 100. The receive waveforms 225A-225C include respective pulses 216A-216C that represent the times $t_A$-$t_C$ at which corresponding reflected light pulses 125A-125C are received by the LIDAR device 100. The reception times $t_A$-$t_C$ may be determined from respective pulses 226A-226C using any suitable peak detection technique (e.g., determining a peak amplitude, determining a centroid, determining a mean time between threshold crossings, and the like). The determined reception times $t_A$-$t_C$ may be used to determine distances between the LIDAR device 100 and respective portions 205A-205C of the environment 200.

Figure 3:
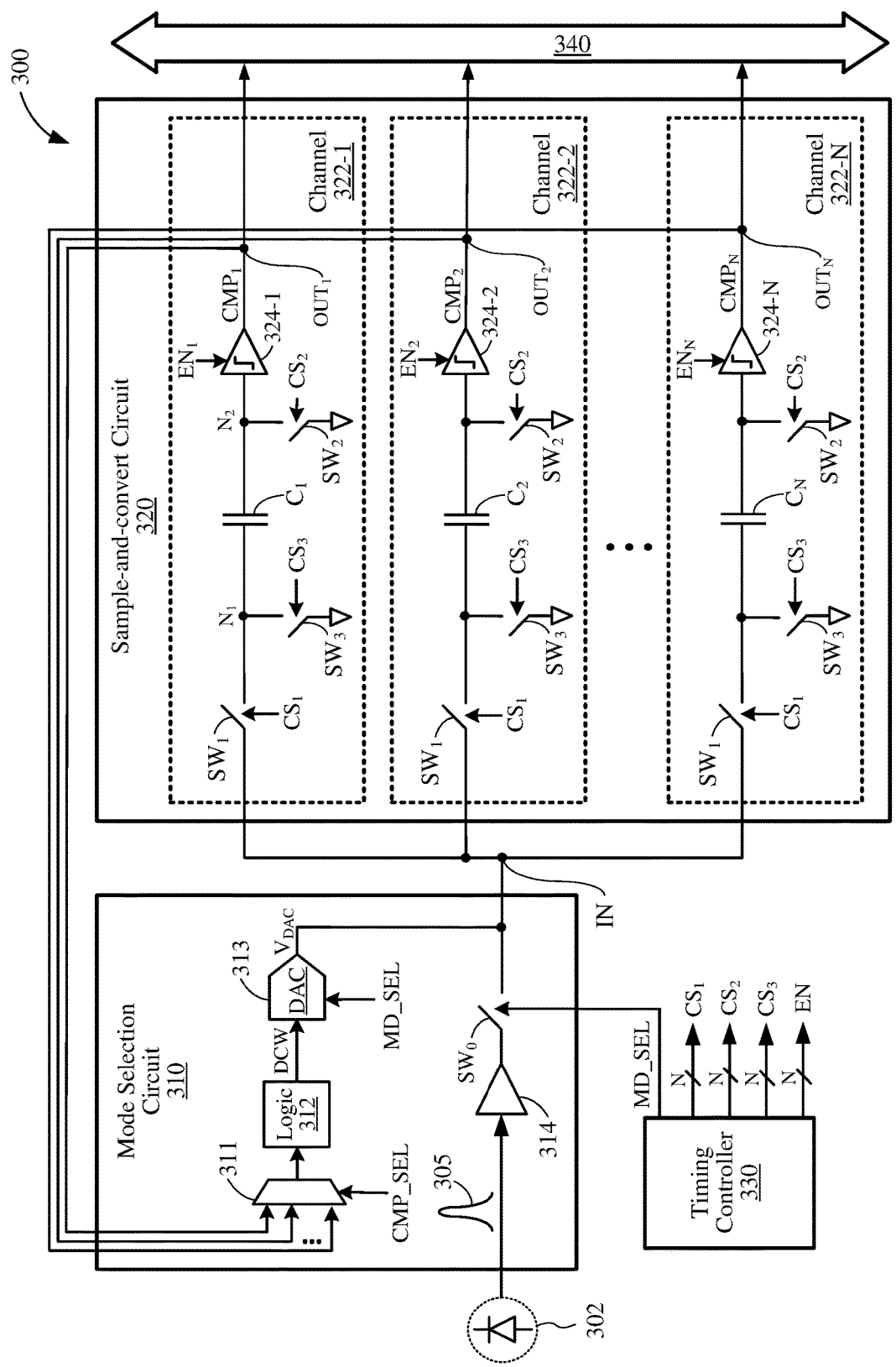
FIG. 3 is a circuit diagram of an example detector circuit suitable for use in a LIDAR receiver.

FIG. 3 is a circuit diagram of an example detector circuit 300 suitable for use in a LIDAR device. In some implementations, the detector circuit 300 may be one example of the detector circuit 122 of FIG. 1. The detector circuit 300 is shown to include a mode selection circuit 310, a sample-and-convert circuit 320, a timing controller 330, and an output bus 340. In the example of FIG. 3, a photodiode 302 generates a photodetector signal 305 in response to receiving or detecting photons associated with received light pulses 125. In some aspects, the amount of current generated by the photodiode 302 is proportional to the intensity of photons detected by the photodiode 302, and a magnitude of the photodetector signal 305 may be indicative of intensity levels of the received light pulses 125. In other implementations, any other suitable photodetector may provide the photodetector signal 305 to the detector circuit 300.

The mode selection circuit 310 includes a multiplexer (MUX) 311, a digital logic circuit 312, a digital-to-analog converter (DAC) 313, an amplifier 314, and a mode switch $SW_0$. The amplifier 314 and the mode switch $SW_0$ are coupled between the photodiode 302 and an input node IN of the sample-and-convert circuit 320. The amplifier 314 may be any suitable circuit that can amplify the photodetector signal 305 provided by the photodiode 302. In some aspects, the amplifier 314 may convert a photocurrent generated by the photodiode 302 into a voltage. The mode switch $SW_0$, which is coupled between an output of the amplifier 314 and the input node IN of the sample-and-convert circuit 320, includes a control terminal to receive a mode select (MD_SEL) signal. In some implementations, the mode switch $SW_0$ may be used to select one of a plurality of operating modes for the detector circuit 300 based on the MD_SEL signal. In some aspects, the mode switch $SW_0$ may allow the detector circuit 300 to operate in at least a sample mode and a convert mode. During the sample mode, the mode switch $SW_0$ may be closed and thereby couple the photodiode 302 to the sample-and-convert circuit 320, for example, so that the sample-and-convert circuit 320 can sample the photodetector signal 305. During the convert mode, the mode switch $SW_0$ may be opened and thereby isolate the photodiode 302 from the sample-and-convert circuit 320, for example, to prevent the sample-and-convert circuit 320 from sampling the photodetector signal 305. The opened state of the mode switch $SW_0$ may also allow the DAC 313 to drive the input node IN of the sample-and-convert circuit 320 with a voltage.

The MUX 311 may include a number of electronic switches, amplifiers, buffers, blocking capacitors or other passive filtering elements, and/or other suitable components. For the example of FIG. 3, the MUX 311 includes inputs to receive a number of compare signals $CMP_1$-$CMP_N$ from the sample-and-convert circuit 320, includes an output coupled to an input of the digital logic circuit 312, and includes a control terminal to receive a compare select (CMP_SEL) signal. In some aspects, the MUX 311 provides one of the compare signals $CMP_1$-$CMP_N$ as an input signal to the digital logic circuit 312 based on the CMP_SEL signal. The digital logic circuit 312 may be configured to generate or select a digital code word (DCW) based on the compare signal provided by the MUX 311. In some aspects, the digital code word may be digital bits representative of a voltage captured by the sample-and-convert circuit 320. The DAC 313 may convert the digital code word (DCW) provided by the digital logic circuit 312 into an analog voltage signal $V_{DAC}$. In some aspects, the DAC 313 may be selectively enabled and disabled in response to the MD_SEL signal.

The sample-and-convert circuit 320, which is coupled between the mode selection circuit 310 and the bus 340, may sample the photodetector signal 305 to determine intensity levels of the received light pulses 125 at different times, and may provide signals indicative of the determined intensity levels to the bus 340. In some implementations, the sample-and-convert circuit 320 may use the same capacitors to sample the photodetector signal 305 and to hold the sampled signal for conversion into digital data. In some aspects, each capacitor may capture a value of the photodetector signal 305 at a different time during the sample mode, and may hold the captured value for conversion to digital data during the convert mode. The ability to use the same capacitor to capture data and then hold the captured data for conversion to digital data may decrease circuit area and reduce noise, for example, compared with detectors that use one set of capacitors to sample data and use another set of capacitors to hold the captured data for conversion to digital data.

The sample-and-convert circuit 320 includes a number N of detection channels 322-1 to 322-N connected in parallel between its input node IN and its output nodes $OUT_1$-$OUT_N$, where N is an integer greater than one. For the example of FIG. 3, the output nodes $OUT_1$-$OUT_N$ of the detection channels 322-1 to 322-N are coupled to the output bus 340 and to corresponding inputs of the mode selection circuit 310. In some implementations, the number of detection channels 322-1 to 322-N may measure or determine the intensity levels of a received light pulse 125 at each of a number of different times, for example, by sequentially sampling the photodetector signal 305 and then determining values of the sequential samples.

Each of the detection channels 322-1 to 322-N includes a capacitor (C), a comparator 324, and a number of switches $SW_1$-$SW_3$. Referring to the first detection channel 322-1 as an illustrative example, the capacitor $C_1$ and the comparator 324-1 are connected in series between the input node IN of the sample-and-convert circuit 320 and a first output node $OUT_1$ of the sample-and-convert circuit 320. The capacitor $C_1$ includes a first plate (e.g., a top plate) connected to a first node $N_1$, includes a second plate (e.g., a bottom plate) connected to a second node $N_2$, and may be used to capture and hold a value indicative of an intensity of the received light pulse 125. In some implementations, the captured value may a differential voltage across the capacitor $C_1$ (e.g., between the top and bottom plates of the capacitor $C_1$). In other implementations, the bottom plate of the capacitor $C_1$ may be connected to the first node $N_1$, and the top plate of the capacitor $C_1$ may be connected to the second node $N_2$. As such, specific references herein to the top and bottom plates of capacitors $C_1$-$C_N$ are for illustrative purposes only.

The first switch $SW_1$ is connected between node $N_1$ and the input node IN of the sample-and-convert circuit 320, and may selectively couple the top plate of the capacitor $C_1$ to the mode selection circuit 310 based on a first control signal $CS_1$. The second switch $SW_2$ is connected between node $N_2$ and ground potential, and may selectively couple the bottom plate of the capacitor $C_1$ to ground potential based on a second control signal $CS_2$. The third switch $SW_3$ is connected between node $N_1$ and ground potential, and may selectively couple the top plate of the capacitor $C_1$ to ground potential based on a third control signal $CS_3$. The switches $SW_1$-$SW_2$ within each of the channels 322-1 to 322-N of the example detector circuit 300 are described herein as coupled to ground potential for illustrative purposes only; in other implementations, the switches $SW_2$-$SW_3$ within each of the channels 322-1 to 322-N may be coupled to any suitable supply voltage, voltage rail, or voltage source (such as a fixed DC voltage) that can be generated either on-chip or off-chip. Thus, as used herein, the term ground potential may refer to any suitable supply voltage, voltage rail, or voltage source (such as a fixed DC voltage).

In some implementations, each of the switches $SW_1$-$SW_3$ may be a CMOS switch including an NMOS transistor and a PMOS transistor connected in parallel with each other. In some aspects, each of their control signals $CS_1$-$CS_3$ may include a first signal provided to the gate of the NMOS transistor and a second signal provided to the gate of the PMOS transistor (e.g., such that the first and second signals are logical complements of each other). In other implementations, each of the switches $SW_1$-$SW_3$ may be either an NMOS transistor or a PMOS transistor, and each of their control signals $CS_1$-$CS_3$ may be provided to the gate of the corresponding NMOS or PMOS transistor.

The comparator 324-1 includes an input coupled to the bottom plate of the capacitor $C_1$ at node $N_2$, and includes an output (e.g., output node $OUT_1$) coupled to the output bus 340 and to a corresponding input of the MUX 311. The comparator 324-1 may compare a voltage captured by the capacitor $C_1$ with a reference voltage ($V_{REF}$) to generate a compare signal ($CMP_1$). In some implementations, the comparator 324-1 may assert $CMP_1$ (e.g., to logic high) when the captured voltage is greater than the reference voltage, and may de-assert $CMP_1$ (e.g., to logic low) when the captured voltage is less than or equal to the reference voltage. In other implementations, the compare signal $CMP_1$ may indicate whether the captured voltage is greater than the reference voltage, is less than the reference voltage, or is equal to the reference voltage. Although not shown in FIG. 3 for simplicity, each of the comparators 324-1 to 324-N may include a second input to receive the reference voltage. For the examples described herein, the reference voltage is ground potential (e.g., $V_{REF}$=0 volts). In other implementations, the reference voltage $V_{REF}$ may be any other suitable value, particularly for implementations in which the switches $SW_2$-$SW_3$ are connected to a supply voltage other than ground potential.

Each of the comparators 324-1 to 324-N may include a control terminal to receive a respective one of enable signals $EN_1$ to $EN_N$. The enable signals $EN_1$ to $EN_N$ may control or determine when the comparators 324-1 to 324-N perform comparison operations to generate respective compare signals $CMP_1$ to $CMP_N$. In some aspects, assertion of each enable signal EN (e.g., to logic high) may allow a corresponding comparator 324 to drive its compare signal CMP to a logic state in response to a comparison between a captured voltage and the reference voltage $V_{REF}$, and de-assertion of each enable signal EN (e.g., to logic low) may prevent the corresponding comparator 324 from changing the logic state of its compare signal CMP. In this manner, the enable signals $EN_1$ to $EN_N$ may be de-asserted to prevent respective compare signals $CMP_1$ to $CMP_N$ from inadvertently changing logic states (such as when the comparators 324-1 to 324-N are not performing comparison operations.

In some implementations, the enable signals $EN_1$ to $EN_N$ may be independently controlled so that the comparators 324-1 to 324-N can be enabled (and disabled) for compare operations at different times. In some aspects, the enable signals $EN_1$ to $EN_N$ may be generated by the timing controller 330, as depicted in FIG. 3. In other aspects, the enable signals $EN_1$ to $EN_N$ may be generated by any other suitable timing circuit or logic.

Further, although not shown in FIG. 3 for simplicity, each of the comparators 324-1 to 324-N may be independently trimmed to compensate for random offsets resulting from imperfections and defects inherent in semiconductor fabrication processes.

The compare signals $CMP_1$-$CMP_N$ generated by respective comparators 324-1 to 324-N may be provided to the output bus 340, which in turn may route the compare signals $CMP_1$-$CMP_N$ to the ADC 123 of FIG. 1. The ADC 123 may convert analog representations of light intensity values into digital data that can be processed and analyzed by digital components. For example, the DSP 133 and/or the processor 131 of FIG. 1 may process the digital data to detect objects in the surrounding environment, to determine distances to the detected objects, to determine various features (e.g., size, shape, orientation, and motion) of the detected objects, to generate a 3D map of the surrounding environment, and so on.

The compare signals $CMP_1$-$CMP_N$ may also be selectively provided to the digital logic circuit 312 via the MUX 311. The MUX 311 may select one of the compare signals $CMP_1$-$CMP_N$ based on the CMP_SEL signal, and may provide the selected compare signal to the digital logic circuit 312. The digital logic circuit 312 may generate and/or adjust a digital code word (DCW) based, at least in part, on the selected compare signal. In some implementations, the digital code word generated by the digital logic circuit 312 may be representative of the magnitudes of captured voltages held by the capacitors $C_1$-$C_N$ of respective detection channels 322-1 to 322-N, as described below. Although not shown in FIG. 3 for simplicity, the digital code word may be provided as an output signal of the detector circuit 300.

The timing controller 330 may generate the MD_SEL signal for the mode selection circuit 310, may generate a set of control signals $CS_1$-$CS_3$ for each of the detection channels 322-1 to 322-N, and may generate the enable signals $EN_1$-$EN_N$. The MD_SEL signal may control operation of the mode switch $SW_0$, for example, such that an asserted state of the MD_SEL signal causes the mode switch $SW_0$ to close (or to remain closed), and a de-asserted state of the MD_SEL signal causes the mode switch $SW_0$ to open (or to remain open). In some aspects, the logic state of the MD_SEL signal may indicate or determine whether the detector circuit 300 is operating in the sample mode or the convert mode.

The MD_SEL signal may also control operation of the DAC 313. In some aspects, assertion of the MD_SEL signal may disable the DAC 313 or prevent the DAC 313 from driving the input node IN of the sample-and-convert circuit 320 with the output voltage $V_{DAC}$, and de-assertion of the MD_SEL signal may enable the DAC 313 or allow the DAC 313 to drive the input node IN of the sample-and-convert circuit 320 with the output voltage $V_{DAC}$.

Each set of control signals $CS_1$-$CS_3$ may control operations of corresponding switches $SW_1$-$SW_3$ within a respective one of the detection channels 322-1 to 322-N. In some implementations, the timing controller 330 may generate a unique set of control signals $CS_1$-$CS_3$ for each of the detection channels 322-1 to 322-N, for example, so that various operations (e.g., capturing values, holding values, and quantizing values) of the detection channels 322-1 to 322-N may be performed independently of one another and/or at different times. In this manner, the timing controller 330 may allow the photodetector signal 305 to be sequentially sampled by different detection channels 322-1 to 322-N at different times (e.g., at a number N of different sampling times). In some aspects, the timing controller 330 may determine the order in which the detection channels 322-1 to 322-N are to sample the photodetector signal 305 and/or may determine the order in which the detection channels 322-1 to 322-N are to determine a magnitude of the sampled photodetector signal 305.

Figure 4:
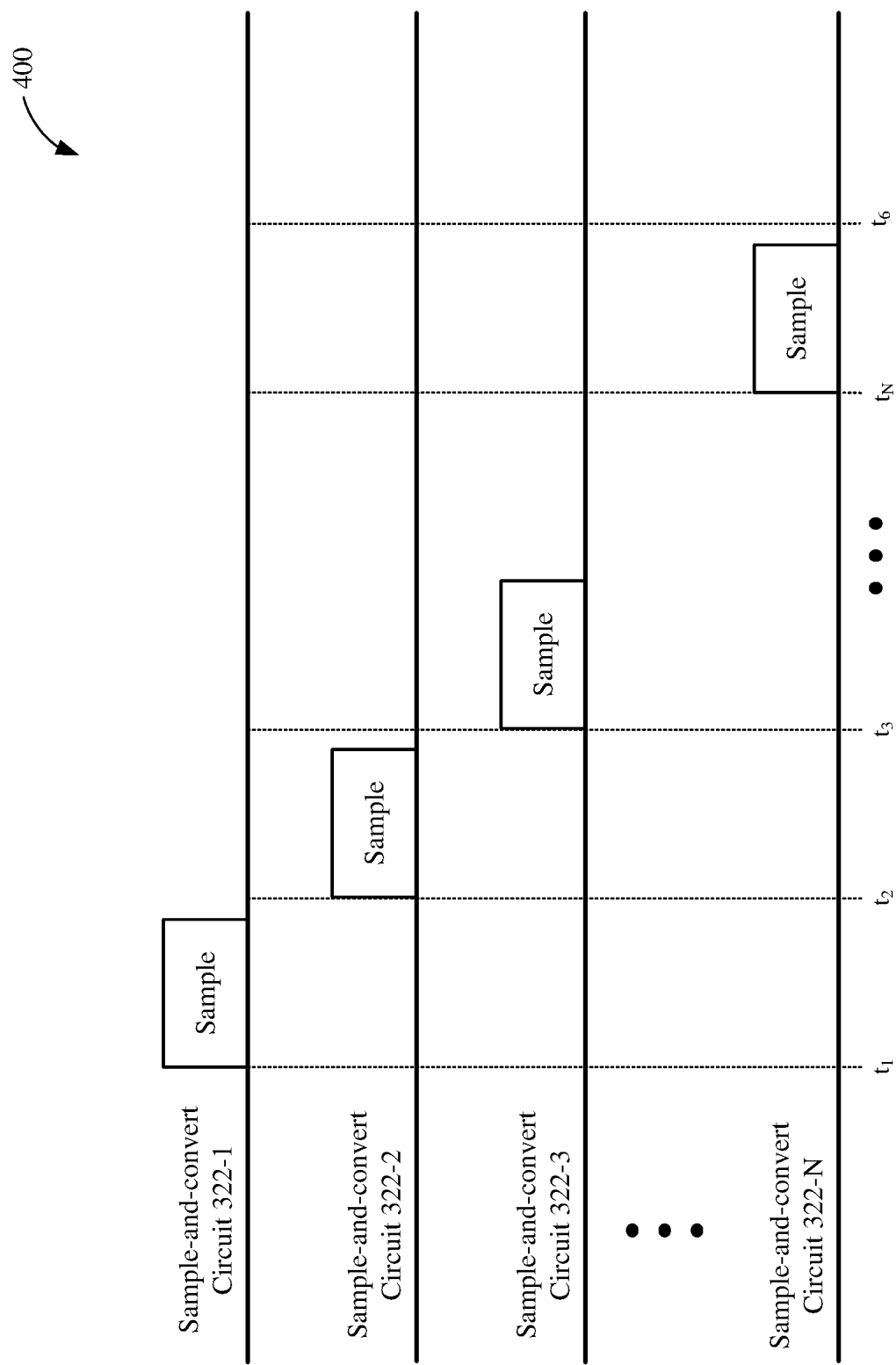
FIG. 4 is a timing diagram depicting an example operation of a detector circuit according to various implementations.

In some implementations, the timing controller 330 may sequentially assert (and de-assert) the first control signals $CS_1$ to control the first switches $SW_1$ such that each of the detection channels 322-1 to 322-N receives the photodetector signal 305 at a different time, and may sequentially assert (and de-assert) the enable signals $EN_1$ to $EN_N$ such that each of the comparators 324-1 to 324-N can be enabled to determine an intensity value of the received light pulse 125 at a different time (such as by allowing the comparators 324-1 to 324-N to drive corresponding compare signals $CMP_1$-$CMP_N$ to either logic low or logic high based on voltages captured by respective capacitors $C_1$-$C_N$ during different sampling intervals). In one example, the timing controller 330 may sequentially assert (and de-assert) the first control signals $CS_1$ and the enable signals $EN_1$ to $EN_N$ in a manner that causes the first detection channel 322-1 to sample the photodetector signal 305 (or capture a value indicative of the photodetector signal 305) at a first time $t_1$, causes the second detection channel 322-2 to sample the photodetector signal 305 (or capture a value indicative of the photodetector signal 305) at a second time $t_2$, causes the third detection channel 322-3 to sample the photodetector signal 305 (or capture a value indicative of the photodetector signal 305) at a third time $t_3$, and so on, and causes the $N^{th}$ detection channel 322-N to sample the photodetector signal 305 (or capture a value indicative of the photodetector signal 305) at an $N^{th}$ time $t_N$, as depicted by the example timing diagram 400 of FIG. 4. In another example, the timing controller 330 may sequentially assert (and de-assert) the first control signals $CS_1$ and the enable signals $EN_1$ to $EN_N$ in a manner that causes the detection channel 322-1 to 322-N to sample the photodetector signal 305 (or capture a value indicative of the photodetector signal 305) in any other suitable order.

In some aspects, the timing controller 330 may include or be coupled to a memory that stores one or more of a sampling schedule indicating an order in which the detection channel 322-1 to 322-N are to sample the photodetector signal 305, selected times at which each of the detection channels 322-1 to 322-N are to sample the photodetector signal 305, information indicating the logic states of the MD_SEL signal, the logic states of the enable signals $EN_1$ to $EN_N$, and the logic states of the control signals $CS_1$-$CS_3$ as a function of time, and other suitable information.

In some implementations, the timing controller 330 may also generate the CMP_SEL signal that is provided to the MUX 311. In some aspects, generation of the CMP_SEL signal may be based, at least in part, on the MD_SEL signal and/or the control signals $CS_1$-$CS_3$. In addition, or in the alternative, generation of the CMP_SEL signal may be based, at least in part, on the compare signals $CMP_1$-$CMP_N$. In other aspects, generation of the CMP_SEL signal may be based on the sampling schedule.

An example operation of the detector circuit 300 is described herein for illustrative purposes only. One of ordinary skill in the art will readily understand that many other operations may be performed by the detector circuit 300, and therefore this disclosure is not limited to any particular examples described herein. In some implementations, the detector circuit 300 may operate in a number of modes including at least a sample mode and a convert mode. The detector circuit 300 may operate in the sample mode to capture and hold values indicative of intensity levels of reflected light pulses 125 received by the photodiode 302, and may operate in the convert mode to determine magnitude information of the captured values and to convert the determined magnitudes into digital data.

Figure 5A:
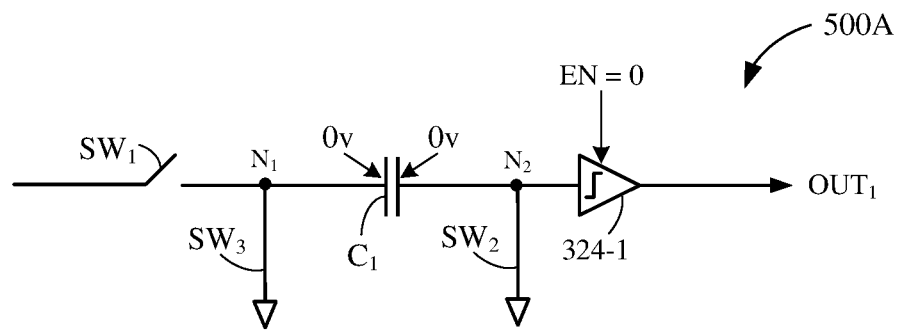
FIGS. 5A-5F depict different detector circuit configurations for sampling a signal and then converting the sampled signal into digital data, according to various implementations.

In some implementations, the timing controller 330 may initialize the detector circuit 300 by asserting control signals $CS_2$-$CS_3$ to close the second and third switches $SW_2$-$SW_3$ in each of the detection channels 322-1 to 322-N, as depicted in the illustration 500A of FIG. 5A. Closing the second switches $SW_2$ may allow the bottom plates of capacitors $C_1$-$C_N$ to discharge low (e.g., toward ground potential), and closing the third switches $SW_3$ may allow the top plates of capacitors $C_1$-$C_N$ to discharge low (e.g., toward ground potential). In this manner, residual charges stored on the top and bottom plates of the capacitors $C_1$-$C_N$ may be discharged to ground potential (e.g., to approximately 0 volts) prior to sampling operations. The timing controller 330 may also de-assert the first control signals $CS_1$ to open the first switch $SW_1$ in each of the detection channels 322-1 to 322-N, for example, to prevent premature sampling of the photodetector signal 305. The timing controller 330 may also de-assert the enable signals $EN_1$ to $EN_N$ to disable respective comparators 324-1 to 324-N, for example, to prevent inadvertent changes in or updates to the logic states of corresponding compare signals $CMP_1$-$CMP_N$.

In some implementations, the timing controller 330 may prepare the detector circuit 300 for sampling operations by de-asserting all of the third control signals $CS_3$ so that the third switch $SW_3$ in each of the detection channels 322-1 to 322-N is opened. In this manner, node $N_1$ in each of the detection channels 322-1 to 322-N may be isolated from ground potential, thereby allowing the top plate of each of respective capacitors $C_1$-$C_N$ to be charged to a voltage based on the photodetector signal 305. The second switches $SW_2$ in each of the detection channels 322-1 to 322-N may remain closed to maintain the bottom plates of respective capacitors $C_1$-$C_N$ at ground potential (e.g., at approximately 0 volts).

Referring also to FIG. 1, the photodiode 302 receives light pulses 125 reflected from objects in a surrounding environment, and may generate a photodetector signal 305 indicative of intensity levels of the received light pulses 125. The photodetector signal 305 may be a current generated by the photodiode 302 in response to detecting photons associated with the received light pulses 125. In some implementations, the sample mode may be initiated by asserting the MD_SEL signal (e.g., to logic high). The asserted state of MD_SEL may close the mode switch $SW_0$ so that current generated by the photodiode 302 can flow to the sample-and-convert circuit 320 through the amplifier 314. The asserted state of MD_SEL may also prevent the DAC 313 from driving the input node IN of the sample-and-convert circuit 320 with the voltage $V_{DAC}$ (e.g., by disabling the DAC 313 or by de-coupling the DAC 313 from the input node IN).

During the sample mode, the detection channels 322-1 to 322-N may sequentially sample the photodetector signal 305 at different times to capture intensity information of the received light pulses 125 at each of the different times. The timing controller 330 may individually enable the detection channels 322-1 to 322-N to sample the photodetector signal 305 by selectively closing the first switches $SW_1$ (based on the first control signals $CS_1$) coupled between the mode selection circuit 310 and each of the detection channels 322-1 to 322-N. For purposes of discussion herein, the timing controller 330 initially selects the first detection channel 322-1 for the capture operation by asserting a first control signal $CS_1$ that closes the first switch $SW_1$ in the first detection channel 322-1. When closed, the first switch $SW_1$ couples the capacitor $C_1$ to the mode selection circuit 310 via the input node IN of the sample-and-convert circuit 320. In some implementations, the timing controller 330 may prevent the non-selected detection channels 322-2 to 322N from sampling data concurrently with the first detection channel 322-1 by de-asserting the first control signals $CS_1$ provided to the non-selected detection channels 322-2 to 322-N. The de-asserted first control signals $CS_1$ cause the first switches $SW_1$ in the non-selected detection channels 322-2 to 322-N to remain open, thereby isolating respective capacitors $C_2$-$C_N$ from the input node IN of the sample-and-convert circuit 320.

Figure 5B:
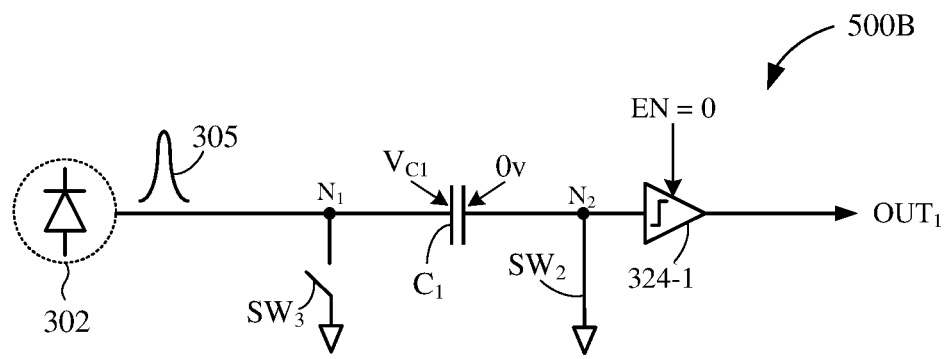

The photodetector signal 305 is coupled to the first detection channel 322-1 by the closed first switch $SW_1$ and charges the top plate of the capacitor $C_1$ to a voltage $V_{C1}$, as depicted in the illustration 500B of FIG. 5B. For purposes of discussion herein, the voltage $V_{C1}$=113 mV (although the voltage $V_{C1}$ may be of other values). The bottom plate of the capacitor $C_1$ is coupled to ground potential by the closed second switch $SW_2$, which allows a differential voltage $V_{DIFF}$=113 mV to appear across the capacitor $C_1$. The enable signal $EN_1$ may be maintained in its de-asserted state to prevent the comparator 324-1 from performing compare operations prematurely.

Figure 5C:
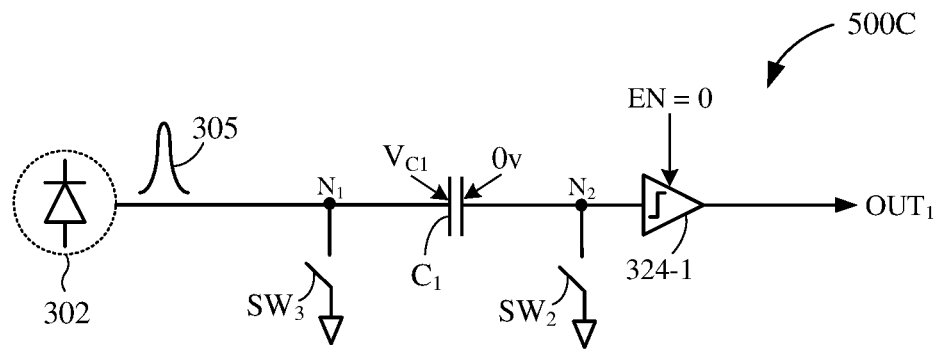

After the top plate of the capacitor $C_1$ is charged to $V_{C1}$, the timing controller 330 may de-assert the second control signal $CS_2$ to open the second switch $SW_2$, thereby isolating the bottom plate of the capacitor $C_1$ from ground potential, as depicted in the illustration 500C of FIG. 5C. As a result, charge stored between the plates of capacitor $C_1$ may remain constant even if the voltage at the input node IN changes, and therefore the voltage differential $V_{DIFF}$=113 mV across capacitor $C_1$ may also remain constant irrespective of voltage changes at the input node IN (and irrespective of changes in voltage on the top plate of capacitor $C_1$). The enable signal $EN_1$ may be maintained in its de-asserted state to prevent the comparator 324-1 from performing compare operations prematurely.

Figure 5D:
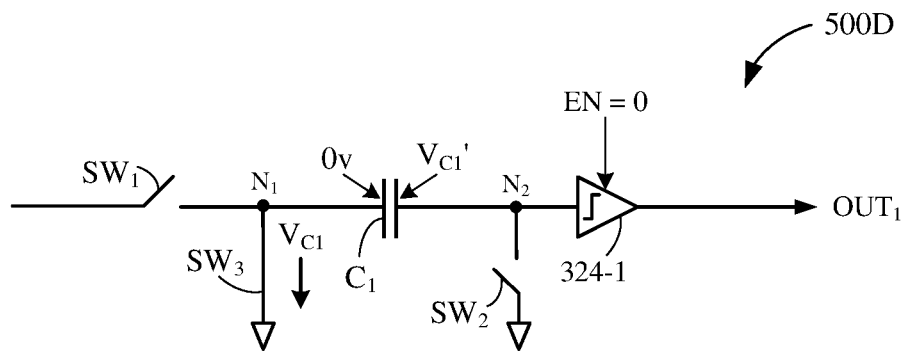

Then, the timing controller 330 may close the third switch $SW_3$ and open the first switch $SW_1$ (e.g., by asserting the third control signal $CS_3$ and de-asserting the first control signal $CS_1$). The closed third switch $SW_3$ couples node $N_1$ to ground potential, which may pull the voltage on the top plate of capacitor $C_1$ low towards ground potential (e.g., to approximately zero volts). The opened first switch $SW_1$ isolates capacitor $C_1$ from the input node IN (and from the photodetector signal 305). The second switch $SW_2$ remains open to isolate node $N_2$ from ground potential, thereby preventing the voltage on the bottom plate of capacitor $C_1$ from being pulled to ground potential. As the voltage on the top plate of capacitor $C_1$ decreases to ground potential, the charge stored between the plates of capacitor $C_1$ induces a negative voltage on the bottom plate of capacitor $C_1$ and thereby maintains a constant differential voltage across the capacitor $C_1$. For example, as the voltage of the top plate of capacitor $C_1$ is pulled from a positive voltage $V_{C1}$ to approximately 0 volts by closing the third switch $SW_3$, a negative voltage $V_{C1}'$ equal in magnitude to $V_{C1}$ is induced on the bottom plate of capacitor $C_1$, as depicted by the illustration 500D of FIG. 5D. More specifically, although the amount of charge stored by capacitor $C_1$ remains constant, the reference point of the corresponding differential voltage $V_{DIFF}$ "moves" from the top plate of capacitor $C_1$ to the bottom plate of capacitor $C_1$. In this manner, the comparator 324-1 may reference the differential voltage $V_{DIFF}$ from the bottom plate of capacitor $C_1$ as the induced negative voltage $V_{C1}'$.

In the above example, the top plate of capacitor $C_1$ was previously charged to $V_{C1}$=113 mV, and therefore a voltage of $V_{C1}'$=−113 mV may be induced on the bottom plate of capacitor $C_1$ when the third switch $SW_3$ is closed. Thus, in accordance with various implementations described herein, the captured voltage $V_{C1}$ may be represented by a differential voltage $V_{DIFF}$ across the capacitor $C_1$ that can be referenced from the bottom plate of capacitor $C_1$ (rather than from the top plate of capacitor $C_1$) and provided to the input of the comparator 324-1. In addition, because the second switch $SW_2$ remains open after the differential voltage $V_{DIFF}$ appears across the capacitor $C_1$, the differential voltage $V_{DIFF}$ may remain constant even if the voltage at the input node IN or the voltage of the top plate of capacitor $C_1$ changes. This may allow the capacitor $C_1$ to not only sample and capture a voltage indicative of an intensity level of the received light pulse 125, but also to store the captured voltage until its magnitude can be determined and/or converted to digital data. In this manner, the detector circuit 300 can use a single capacitor (e.g., capacitor $C_1$) to sample a value of the photodetector signal 305 and also to hold the sampled value while its magnitude is determined and/or converted to digital data.

Moreover, because the differential voltage $V_{DIFF}$ across capacitor $C_1$ remains constant after the second switch $SW_2$ is opened to isolate node $N_2$ from ground potential, timing requirements associated with controlling the first and third switches $SW_1$ and $SW_3$ may be relaxed. More specifically, because the differential voltage $V_{DIFF}$ across capacitor $C_1$ may be insensitive to changes in current or voltage at the input node IN, timing errors associated with opening and closing the first and third switches $SW_1$ and $SW_3$ may not adversely affect performance or accuracy of the detector circuit 300.

Figure 5E:
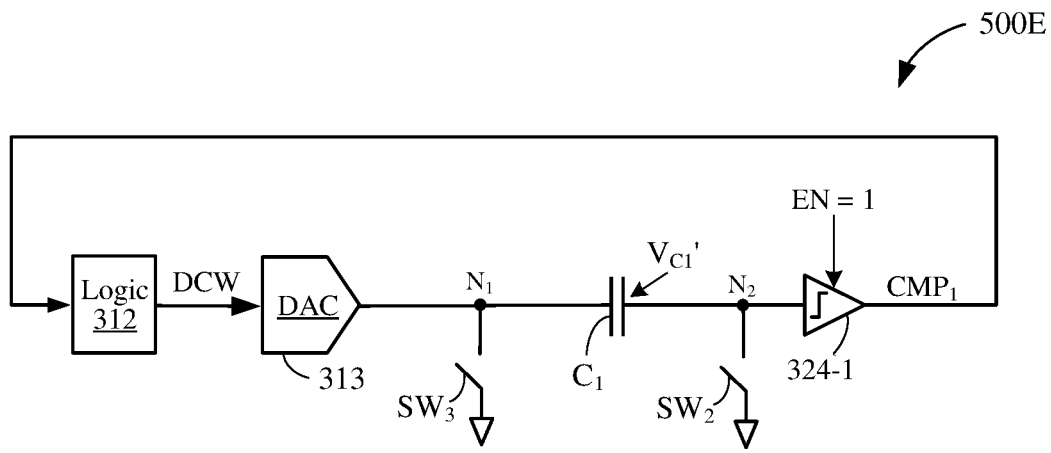

The detector circuit 300 may enter the convert mode to determine the value of the captured voltage $V_{C1}$ and to provide the determined value as digital data to the DSP 133 of FIG. 1 (e.g., for processing to determine distances to objects, to generate a point cloud, and so on). In some implementations, the detector circuit 300 may be transitioned from the sample mode to the convert mode by de-asserting the MD_SEL signal (e.g., to logic low). The de-asserted state of MD_SEL may open the mode switch $SW_0$ to isolate the photodiode 302 from the input node IN of the sample-and-convert circuit 320, thereby preventing the sample-and-convert circuit 320 from receiving the photodetector signal 305. The de-asserted state of MD_SEL may also allow the DAC 313 to drive the input node IN of the sample-and-convert circuit 320 with the voltage $V_{DAC}$ (e.g., by enabling the DAC 313 or by coupling the DAC 313 to the input node IN of the sample-and-convert circuit 320). The timing controller 330 may open the third switch $SW_3$ to isolate the top plate of capacitor $C_1$ from ground potential. The second switch $SW_2$ may remain open to maintain the voltage differential $V_{DIFF}$ across the capacitor $C_1$, and the first switch $SW_1$ may be closed to couple the top plate of capacitor $C_1$ to the input node IN of the sample-and-convert circuit 320. The timing controller 330 may also assert the enable signal $EN_1$ (e.g., to logic high) to enable the comparator 324-1 to perform compare operations, as depicted by the illustration 500E of FIG. 5E.

During the convert mode, the comparator 324-1 compares the voltage at its input terminal ($V_{CMP}$) with the reference voltage ($V_{REF}$) to generate the compare signal $CMP_1$, where $V_{REF}$=0 for the examples described herein. In some implementations, an asserted state of the compare signal $CMP_1$ may indicate that the comparator input voltage $V_{CMP}$ is greater than the reference voltage $V_{REF}$, and a de-asserted state of the compare signal $CMP_1$ may indicate that the comparator input voltage $V_{CMP}$ is less than or equal to the reference voltage $V_{REF}$. Thus, for the examples described herein, the comparator 324-1 drives the compare signal $CMP_1$ to logic high if $V_{CMP}>V_{REF}$, and drives the compare signal $CMP_1$ to logic low if $V_{CMP} \leq V_{REF}$.

Figure 5F:
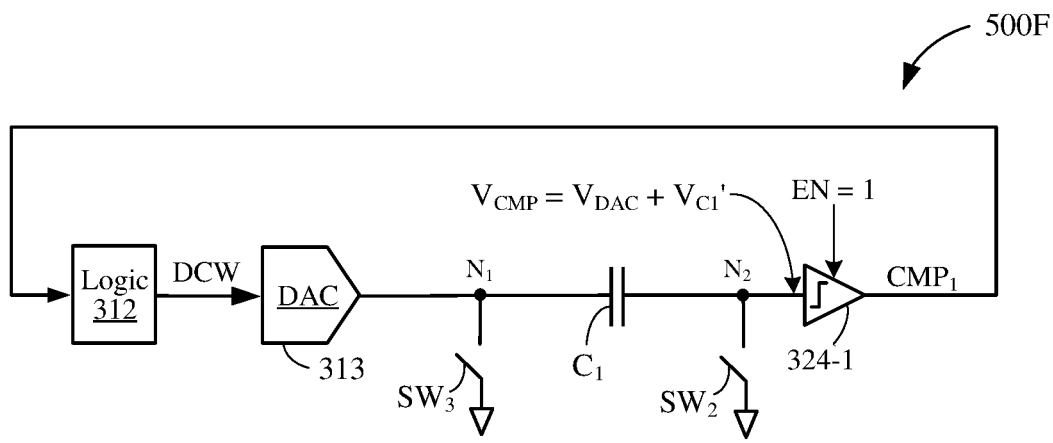

The compare signal $CMP_1$ is provided as an input signal to the digital logic circuit 312 via the MUX 311. The digital logic circuit 312 may select a digital code word (DCW) based at least in part on the logic state of the compare signal $CMP_1$, and the DAC 313 may convert the digital code word into an analog output voltage $V_{DAC}$. The closed first switch $SW_1$ couples the capacitor $C_1$ to the output of the DAC 313, thereby allowing the top plate of the capacitor $C_1$ to be charged to a voltage approximately equal to the voltage $V_{DAC}$. The voltages on the top and bottom plates of the capacitor $C_1$ may be combined (e.g., added or summed) to generate the comparator input voltage such that $V_{CMP}=V_{DAC}+V_{C1}$, as depicted in the illustration 500F of FIG. 5F. Because the voltage $V_{C1}'$ on the bottom plate of capacitor $C_1$ is negative, the comparator 324-1 drives $CMP_1$ to logic high if the magnitude of $V_{DAC}$ is greater than the magnitude of $V_{C1}'$, and drives $CMP_1$ to logic low if the magnitude of $V_{DAC}$ is not greater than the magnitude of $V_{C1}'$.

For the above example in which $V_{DIFF}$=113 mV (and thus $V_{C1}'$=−113 mV), the comparator 324-1 drives $CMP_1$ to logic low when $V_{DAC} \leq 113$ mV. The logic low state of $CMP_1$ causes the digital logic circuit 312 to select a greater value (e.g., a more positive value) for the digital code word (DCW), and the DAC 313 converts the new DCW into an updated analog output voltage $V_{DAC}'$. The comparator 324-1 compares the updated voltage $V_{DAC}'$ with $V_{CMP}$=113 mV, and drives the compare signal $CMP_1$ in response thereto. If $CMP_1$ is driven to logic low (e.g., indicating that $V_{DAC}' \leq 113$ mV), then the digital logic circuit 312 may select a greater value (e.g., a more positive value) for the digital code word. Conversely, if $CMP_1$ is driven to logic high (e.g., indicating that $V_{DAC}'>113$ mV), then the digital logic circuit 312 may select a lower value (e.g., a less positive value) for the digital code word. This process may be repeated until the value of the digital code word corresponding to the point at which the comparator 324-1 transitions the compare signal $CMP_1$ between logic low and logic high is identified. In some aspects, a logic low to logic high transition of the compare signal $CMP_1$ may trigger the digital logic circuit 312 to capture the value of the digital code word which caused the low-to-high transition of $CMP_1$.

The identified value of the digital code word may be a digital representation of the captured voltage $V_{C1}$ on capacitor $C_1$, and may therefore indicate the intensity level of the sampled photodetector signal 305. In some implementations, the identified value of the digital code word may be the output signal of the detector circuit 300, and thereafter provided to the DSP 133 of FIG. 1 for processing (e.g., to detect objects in the surrounding environment, to determine distances to the detected objects, to determine various features of the detected objects, to generate a 3D map of the surrounding environment, and so on). Because the digital code word is a digital signal, the detector circuit 300 may not need an ADC to convert analog voltages captured by the capacitors $C_1$-$C_N$ into digital data, which may further reduce circuit area and/or decrease power consumption (as compared to conventional detector circuits).

The digital logic circuit 312 may employ any suitable technique for selecting new values of the digital code word that iteratively become closer to the value of the captured voltage $V_{C1}$. By way of example, and not limitation, the digital logic circuit 312 may use binary search techniques, linear sweep techniques, a weighted-statistics search technique, or any other suitable technique that can iteratively select voltages closer to the value of the captured voltage.

As mentioned above, because the charge stored between the plates of capacitor $C_1$ remains constant when the second switch $SW_2$ is open, inadvertent changes in current or voltage at the input node IN of the sample-and-convert circuit 320 may not change or upset the differential voltage $V_{DIFF}$ across the capacitor $C_1$. For example, suppose that capacitor $C_1$ captures a first voltage $V_{C1}$=113 mV on its top plate. When the third switch $SW_3$ is closed, the top plate of capacitor $C_1$ discharges low (e.g., toward ground potential) and induces a corresponding negative voltage $V_{C1}'$=−113 mV on the bottom plate of capacitor $C_1$, as discussed above. If the voltage $V_{IN}$ at the input node IN of the sample-and-convert circuit 320 increases to 120 mV, the top plate of capacitor $C_1$ may be charged to a voltage=120 mV. However, because the differential voltage $V_{DIFF}$=113 mV remains constant across the capacitor $C_1$, an increase in voltage on the top plate of capacitor $C_1$ may cause a corresponding increase in voltage on the bottom plate of capacitor $C_1$. Thus, as the voltage on the top plate of capacitor $C_1$ increases from 0 volts to $V_{IN}$=120 mV, the voltage on the bottom plate of capacitor $C_1$ increases from −113 mV to 7 mV (e.g., because −113 mV+120 mV=7 mV).

As disclosed herein, the separate sample and convert modes of the detector circuit 300 may allow a single capacitor (e.g., capacitor $C_1$ of the first detection channel 322-1) to not only sample the value of the photodetector signal 305 but also to hold the captured value for conversion to digital data (e.g., by the digital logic 312). Further, because the sample and convert modes of the detector circuit 300 are separate, the sampling rate of the detector circuit 300 may be different than the conversion rate of the detector circuit 300, and the sampling times of the detector circuit 300 may be different than the conversion times of the detector circuit 300. The ability to use different sampling and conversion rates may allow the detector circuit 300 to exploit one or more characteristics of light pulses associated with LIDAR systems. For example, in some aspects, the conversion rate may be lower than the sampling rate to reduce power consumption associated with digitizing analog values.

Figure 6A:
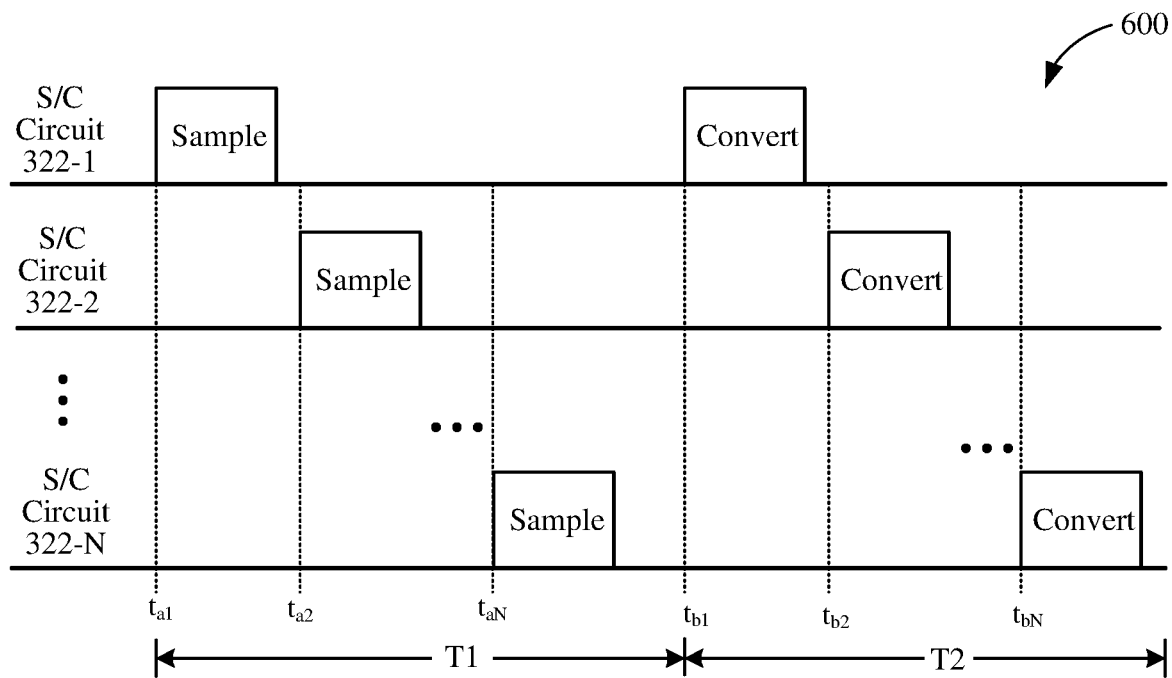
FIG. 6A is a timing diagram depicting sample and convert operations of a detector circuit according to various implementations.

In some implementations, voltages captured by the capacitors $C_1$-$C_N$ when the photodetector signal 305 is sampled by respective detection channels 322-1 to 322-N may be determined by the digital logic circuit 312 in a sequential manner. In some aspects, sample operations for all of the detection channels 322-1 to 322-N may be performed sequentially during a first time period, and convert operations for all of the detection channels 322-1 to 322-N may be performed sequentially during a second time period. For example, FIG. 6A is a timing diagram 600 depicting sample and convert operations of a detector circuit according to various implementations. As depicted in FIG. 6A, the detection channels 322-1 to 322-N sequentially perform sample operations during a first time period T1, and then sequentially perform convert operations during a second time period T2. In some aspects, the first time period T1 may correspond to the sample mode, and the second time period T2 may correspond to the convert mode. More specifically, the detection channels 322-1 to 322-N sequentially sample the photodetector signal 305 at respective times $t_{a1}$-$t_{aN}$ during the first time period T1, and the detection channels 322-1 to 322-N sequentially convert the sampled signal into digital data at respective times $t_{b1}$-$t_{bN}$ during the second time period T2.

Figure 6B:
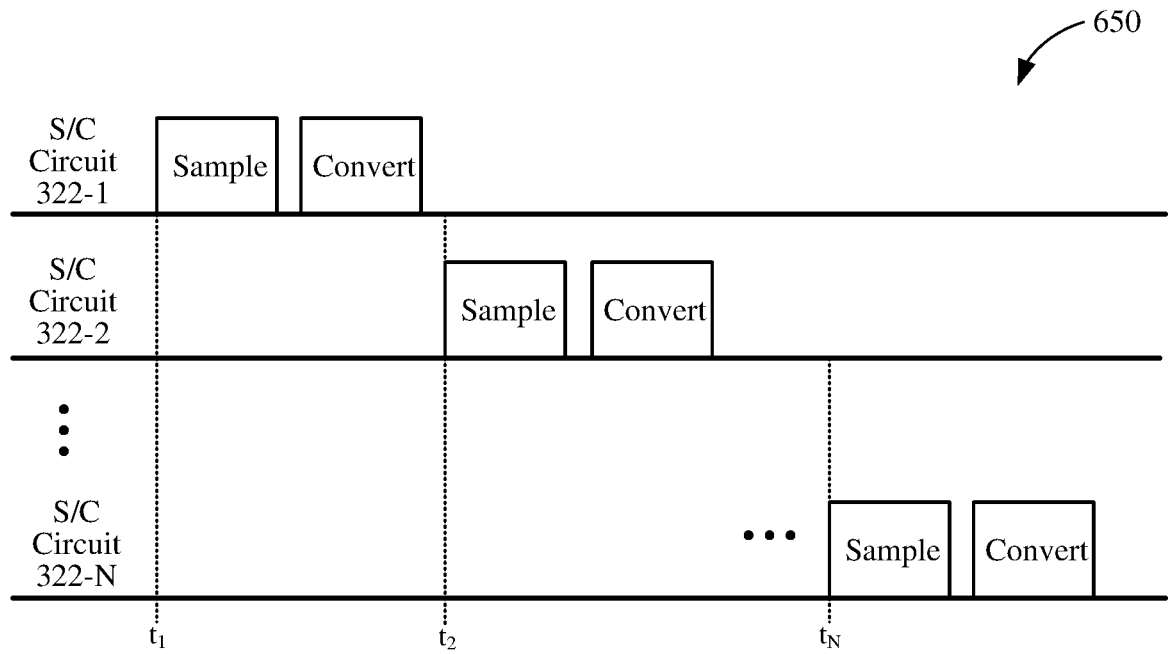
FIG. 6B is another timing diagram depicting sample and convert operations of a detector circuit according to various implementations.

In other aspects, the sample and convert operations may be interleaved for the detection channels 322-1 to 322-N. For example, FIG. 6B is another timing diagram 650 depicting sample and convert operations of a detector circuit according to various implementations. As depicted in FIG. 6B, the first detection channel 322-1 samples the photodetector signal 305 and then converts the sampled signal into digital data beginning at time $t_1$, the second detection channel 322-2 samples the photodetector signal 305 and then converts the sampled signal into digital data beginning at time $t_2$, and so on, such that the $N^{th}$ detection channel 322-N samples the photodetector signal 305 and then converts the sampled signal into digital data beginning at time $t_N$.

In other implementations, voltages captured by the capacitors $C_1$-$C_N$ may be determined by the digital logic circuit 312 concurrently. Referring to FIG. 3, the timing controller 330 may, during the convert mode, close all of the first switches $SW_1$ at the same time so that the comparators 324-1 to 324-N generate respective compare signals $CMP_1$-$CMP_N$ concurrently. If any of the comparators 324-1 to 324-N maintains a logic high value for its respective one of the compare signals $CMP_1$-$CMP_N$, then the digital logic circuit 312 may select new values for the digital code word (DCW) until the DAC 313 generates a value of $V_{DAC}$ that corresponds to a logic low to logic high transition point of the corresponding comparator 324 (e.g., which may indicate that the digital code word (DCW) is an accurate digital representation of the captured voltage). In some aspects, a memory (not shown for simplicity) may store the times at which each of the compare signals $CMP_1$-$CMP_N$ transitions from logic low to logic high and the corresponding value of the digital code word (or the value of $V_{DAC}$). When multiple compare signals $CMP_1$-$CMP_N$ transition from logic low to logic high for the same value of the DCW, the digital logic circuit 312 may determine the magnitude of the corresponding samples concurrently.

Figure 7:
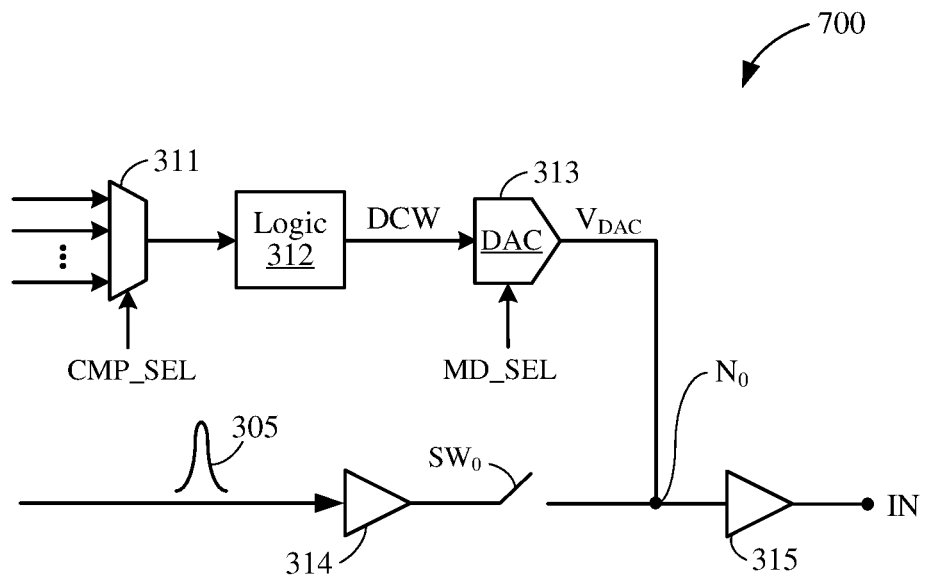
FIG. 7 is a circuit diagram of a portion of another example detector circuit suitable for use in a LIDAR receiver.

FIG. 7 is a circuit diagram of a portion of another example detector circuit 700 that may be used in a LIDAR receiver. The detector circuit 700 of FIG. 7 is similar to the detector circuit 300 of FIG. 3, except that the detector circuit 700 includes an amplifier 315 coupled between the mode switch $SW_0$ and the input node IN of the sample-and-convert circuit 320. The amplifier 315 may be used to amplify the photodetector signal 305 during the sample mode, and may be used to amplify the output voltage $V_{DAC}$ during the convert mode (which may reducing the charging time of one or more of the capacitors $C_1$-$C_N$). In some aspects, the ability to store captured voltages as differential voltages $V_{DIFF}$ across the capacitors $C_1$-$C_N$ may alleviate undesirable effects related to any non-linearities in the amplifier 315. Referring also to FIG. 3, a match condition may be triggered in comparator 324-1 when the output voltage of the DAC 313 equals the captured voltage $V_{C1}'$ of capacitor $C_1$ (e.g., when $V_{DAC}=V_{C1}'$), irrespective of the particular magnitude of $V_{DAC}$ or $V_{C1}'$. Thus, because both the photodetector signal 305 and the DAC output voltage $V_{DAC}$ are amplified by the amplifier 315, errors in the value of $V_{C1}$ caused by non-linear characteristics of the amplifier 315 may be offset by similar errors in the value of $V_{DAC}$. As a result, the detector circuit 700 may not need additional circuitry to compensate for non-linearities of the amplifier 315.

Figure 8:
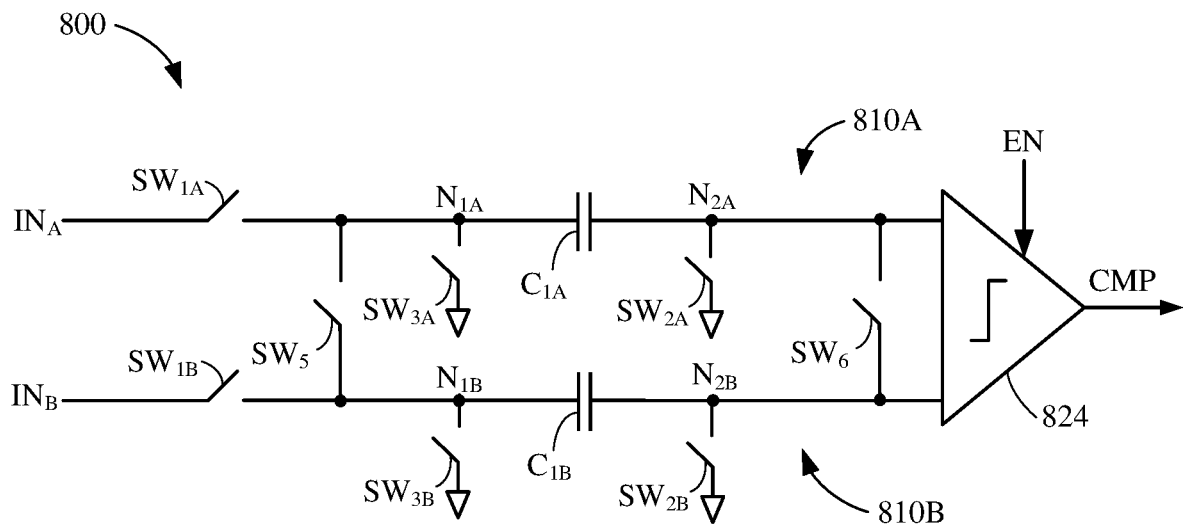
FIG. 8 is a circuit diagram of a differential detection channel according to various implementations.

In other implementations, the detector circuit 300 may operate in a differential manner (e.g., rather than in the single-ended manner described with respect to FIGS. 3-7). FIG. 8 is a circuit diagram of a detection channel 800 that operates in a differential manner, according to various implementations. The detection channel 800 is shown to include differential signal paths 810A and 810B coupled between a comparator 824 and differential input nodes $IN_A$ and $IN_B$, respectively. In some implementations, the detection channel 800 may be used as the detection channels 322-1 to 322-N of the detector circuit 300 of FIG. 3. For such implementations, the differential input nodes $IN_A$ and $IN_B$ may be coupled to an output of the mode selection circuit 310 (e.g., to selectively receive the photodetector signal 305 or the DAC output voltage $V_{DAC}$), and an output of the comparator 824 may be coupled to a corresponding input of the MUX 311. In some aspects, the comparator 824 may be a differential implementation of the comparators 324-1 to 324-N of FIG. 3.

The first differential signal path 810A includes switch $SW_{1A}$ and a capacitor $C_{1A}$ coupled in series between input node $IN_A$ and a first input of comparator 824. The top plate of capacitor $C_{1A}$ is selectively coupled to ground potential by switch $SW_{3A}$, and the bottom plate of capacitor $C_{1A}$ is selectively coupled to ground potential by switch $SW_{2A}$. The switch $SW_{1A}$ may selectively couple the top plate of capacitor $C_{1A}$ to the first input node $IN_A$. The second differential signal path 810B includes switch $SW_{1B}$ and a capacitor $C_{1B}$ coupled in series between input node $IN_B$ and a second input of comparator 824. The top plate of capacitor $C_{1B}$ is selectively coupled to ground potential by switch $SW_{3B}$, and the bottom plate of capacitor $C_{1B}$ is selectively coupled to ground potential by switch $SW_{2B}$. The switch $SW_{1B}$ may selectively couple the top plate of capacitor $C_{1B}$ to the second input node $IN_B$.

The switches $SW_{2A}$-$SW_{3A}$ and $SW_{2B}$-$SW_{3B}$ associated with the detection channel 800 are described herein as coupled to ground potential for illustrative purposes only; in other implementations, the switches $SW_{2A}$-$SW_{3A}$ and $SW_{2B}$-$SW_{3B}$ may be coupled to any suitable voltage supply (such as a fixed DC voltage).

In some implementations, switches $SW_{1A}$ and $SW_{1B}$ may be controlled by the first control signal $CS_1$, switches $SW_{2A}$ and $SW_{2B}$ may be controlled by the second control signal $CS_2$, and switches $SW_{3A}$ and $SW_{3B}$ may be controlled by the third control signal $CS_3$ described above with respect to FIG. 3. Thus, for at least some implementations, sample and convert operations of the detection channel 800 may be similar to the sample and convert operations of the detection channels 322-1 to 322-N of FIG. 3 (e.g., except operating in a differential manner rather than in a single-ended manner).

In some implementations, the detection channel 800 may also include switches $SW_5$ and $SW_6$ coupled between the first and second differential signal paths 810A and 810B. In the example of FIG. 8, switch $SW_5$ is coupled between nodes $N_{1A}$ and $N_{1B}$ of the detection channel 800, and switch $SW_6$ is coupled between the inputs of the comparator 824. The switches $SW_5$ and $SW_6$ may be used to selectively short the first and second differential signal paths 810A and 810B together. In some aspects, switch $SW_5$ may be closed to short the nodes $N_{1A}$ and $N_{1B}$ together when switches $SW_{3A}$ and $SW_{3B}$ are closed, for example, to pull the first and second differential signal paths 810A and 810B low (e.g., to ground potential). Similarly, switch $SW_6$ may be closed to short the nodes $N_{2A}$ and $N_{2B}$ together when switches $SW_{2A}$ and $SW_{2B}$ are closed, for example, to pull the nodes $N_{2A}$ and $N_{2B}$ low (e.g., to ground potential). In other implementations, the switches $SW_5$ and $SW_6$ may be omitted.

The differential operation of the detection channel 800 may provide a number of advantages compared to the single-ended operation of the detection channels 322-1 to 322-N of FIG. 3. In some implementations, the differential signaling of detection channel 800 may reject common-mode errors such as, for example, supply noise, charge injection, spurious coupling, and so on. The differential signaling of detection channel 800 may also allow for faster logic state transitions than the single-ended detection channels 322-1 to 322-N of FIG. 3.

Figure 9:
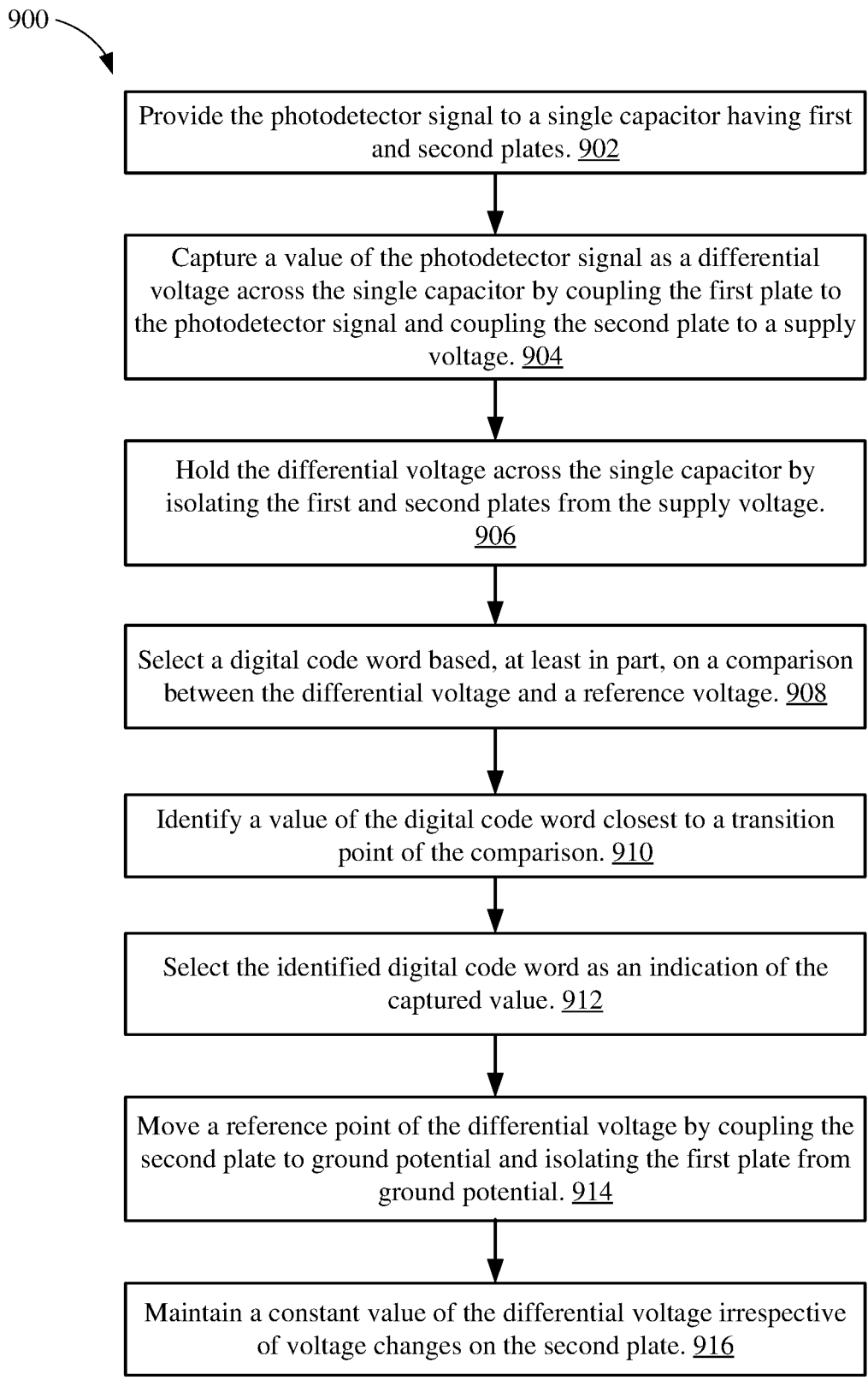
FIG. 9 shows a flow chart depicting an example operation for sampling and converting a signal according to various implementations.

FIG. 9 shows a flow chart depicting an example operation 900 for sampling and converting a signal in accordance with some implementations. The example operation 900 is described below with respect to the LIDAR device 100 of FIG. 1 and the detector circuit 300 of FIG. 3 for illustrative purposes only. One of ordinary skill in the art will recognize that the example operation 900 may be performed by any suitable LIDAR device and/or detector circuit according various implementations, and that the example operation 900 described herein may be performed with additional steps, with fewer steps, with steps in a different order, with steps in parallel, or any combination thereof.

The LIDAR device 100 receives a number of light pulses, and generates a photodetector signal based on detecting photons associated with the received light pulses. In some implementations, the received light pulses may be or may include components of light pulses emitted from LIDAR device 100 and reflected by one or more objects in a surrounding environment. In some aspects, a current of the photodetector signal may be indicative of intensity values of the received light pulses. The photodetector signal is provided to the detector circuit 300.

The detector circuit 300 provides the photodetector signal to a single capacitor having first and second plates (902). In some implementations, the single capacitor may be one of the capacitors $C_1$-$C_N$ of FIG. 3. In some aspects, the first and second plates (e.g., the top and bottom plates, respectively) of capacitor $C_1$ may be discharged to a supply voltage before the detector circuit 300 receives the photodetector signal 305. In some implementations, the supply voltage may be ground potential.

The detector circuit 300 captures a value of the photodetector signal as a differential voltage across the single capacitor by coupling the first plate of the single capacitor to the photodetector signal and coupling the second plate of the single capacitor to the supply voltage (904). In some implementations, the first switch $SW_1$ may be closed to couple the top plate of capacitor $C_1$ to receive the photodetector signal 305, and the second switch $SW_2$ may be closed to pull the voltage on the bottom plate of capacitor $C_1$ low towards ground potential (e.g., to approximately 0 volts).

The detector circuit 300 holds the differential voltage across the single capacitor by isolating the first and second plates from the supply voltage (906). In some implementations, the third switch $SW_3$ may be opened to isolate the top plate of capacitor $C_1$ from ground potential, and the second switch $SW_2$ may be opened to isolate the bottom plate of capacitor $C_1$ from ground potential.

The detector circuit 300 selects a digital code word (DCW) based, at least in part, on a comparison between the differential voltage and a reference voltage (908). In some implementations, the DAC 313 converts the digital code word into an analog voltage ($V_{DAC}$), and provides the analog voltage to the capacitor $C_1$. In response thereto, the differential voltage held across the capacitor $C_1$ changes by an amount equal (or similar) to the analog voltage $V_{DAC}$ provided by the DAC 313.

The detector circuit 300 identifies a value of the digital code word closest to a transition point of the comparison (910). In some implementations, the digital logic circuit 312 may identify a value of the digital code word that is closest to the captured value based on a transition point of the comparator 324-1. In some aspects, the comparator 324-1 asserts the compare signal $CMP_1$ (e.g., to logic high) when the differential voltage $V_{DIFF}$ is greater than the reference voltage $V_{REF}$, and de-asserts the compare signal $CMP_1$ (e.g., to logic low) when the differential voltage $V_{DIFF}$ is less than or equal to the reference voltage $V_{REF}$.

The detector circuit 300 selects the identified digital code word as an indication of the captured voltage (912). In some implementations, the value of the digital code word which resulted in a logic low to logic high transition of the compare signal is selected as the indication of the captured voltage on the capacitor $C_1$.

In some implementations, the detector circuit 300 may move a reference point of the differential voltage across the single capacitor by coupling the first plate to the supply voltage and isolating the second plate from the supply voltage (914). In some aspects, the third switch $SW_3$ may be closed to couple the top plate of capacitor $C_1$ to ground potential, and the second switch $SW_2$ may remain open to isolate the bottom plate of capacitor $C_1$ from ground potential. In addition, or in the alternative, the detector circuit 300 may maintain a constant value of the differential voltage across the single capacitor irrespective of voltage changes on either plate of the capacitor $C_1$ (916).

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor.

In the foregoing specification, the example embodiments have been described with reference to specific example embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A LIDAR detector circuit, comprising:
an input node to receive a photodetector signal;
an output node to generate an output signal indicating a light intensity value of the photodetector signal; and
a sample-and-convert circuit including a number of detection channels coupled in parallel with each other between the input node and the output node, each of the detection channels comprising:
a single capacitor and a comparator connected in series between the input node and the output node, wherein the single capacitor includes a first plate, includes a second plate coupled to an input of the comparator, and is configured to capture a value of the photodetector signal; a first switch configured to selectively couple the first plate of the single capacitor to receive the photodetector signal at the input node of the detector circuit; and
a second switch configured to selectively couple the second plate of the single capacitor to a supply voltage.

2. The LIDAR detector circuit of claim 1, wherein:
the single capacitor is configured to capture the value of the photodetector signal during a sample mode and to hold the captured value as a differential voltage across the single capacitor during a convert mode; and
the comparator is configured to generate a compare signal based on a comparison between the captured value and a reference value.

3. The LIDAR detector circuit of claim 2, further comprising:
a first circuit configured to generate a digital code word based, at least in part, on the compare signal; and
a second circuit configured to convert the digital code word into an analog value, wherein the comparator is further configured to determine whether the analog value is greater than the captured value.

4. The LIDAR detector circuit of claim 3, wherein the first circuit comprises a digital logic circuit configured to iteratively adjust the digital code word until the analog value equals the captured value.

5. The LIDAR detector circuit of claim 3, wherein the first circuit comprises a digital logic circuit configured to identify a value of the digital code word that is closest to the differential voltage.

6. The LIDAR detector circuit of claim 1, further comprising a third switch configured to selectively couple the first plate of the single capacitor to the supply voltage.

7. The LIDAR detector circuit of claim 6, wherein the captured value comprises a differential voltage across the single capacitor, and the second and third switches are configured to move a reference point of the differential voltage from the first plate of the single capacitor to the second plate of the single capacitor.

8. The LIDAR detector circuit of claim 1, wherein a closed state of the first switch allows the single capacitor to sample the photodetector signal, and an open state of the first switch prevents the single capacitor from sampling the photodetector signal.

9. The LIDAR detector circuit of claim 1, wherein the captured value comprises a differential voltage that appears across the single capacitor and remains constant irrespective of voltage changes on either plate of the single capacitor.

10. A LIDAR device, comprising:
   a photodetector configured to generate a photodetector signal based on received light pulses;
   a mode selection circuit to receive the photodetector signal and configured to operate in at least a sample mode and a convert mode; and
   a sample-and-convert circuit including a number of detection channels connected in parallel with each other, each of the detection channels configured to sample a value of the photodetector signal during the sample mode and to hold the sampled value during the convert mode using a single capacitor.

11. The LIDAR device of claim 10, wherein the number of detection channels are configured to sequentially sample the photodetector signal at a number of different times.

12. The LIDAR device of claim 10, wherein the sampled value comprises a differential voltage across the single capacitor that remains constant irrespective of voltage changes on a plate of the capacitor.

13. The LIDAR device of claim 10, wherein each of the detection channels further comprises:
   a first switch configured to selectively couple a first plate of the single capacitor to receive the photodetector signal;
   a second switch configured to selectively couple a second plate of the single capacitor to a supply voltage; and
   a third switch configured to selectively couple the first plate of the single capacitor to the supply voltage.

14. The LIDAR device of claim 13, wherein:
   during a first portion of the sample mode, the second and third switches are configured to enable the single capacitor to store a differential voltage indicative of the sampled value; and
   during a second portion of the sample mode, the second and third switches are configured to move a reference point of the differential voltage from the first plate to the second plate.

15. The LIDAR device of claim 14, wherein:
   during the first portion of the sample mode, the first switch is configured to route the photodetector signal to the single capacitor; and
   during the second portion of the sample mode, the first switch is configured to isolate the single capacitor from the photodetector signal.

16. The LIDAR device of claim 10, wherein each of the detection channels further comprises a comparator coupled between the single capacitor and an output node, the comparator configured to generate a compare signal based on a comparison between the sampled value and a reference value.

17. The LIDAR device of claim 16, further comprising:
   a first circuit configured to select a digital code word based, at least in part, on the compare signal; and
   a second circuit configured to drive the single capacitor to with a selected voltage based on the digital code word, wherein the comparator is further configured to determine whether the selected voltage is greater than the sampled value.

18. A method of determining a light intensity value of a photodetector signal, the method comprising:
   providing the photodetector signal to a single capacitor having first and second plates;
   capturing a value of the photodetector signal as a differential voltage across the single capacitor by coupling the first plate of the single capacitor to the photodetector signal and coupling the second plate of the single capacitor to a supply voltage;
   holding the differential voltage across the single capacitor by isolating the first and second plates from the supply voltage;
   selecting a digital code word based, at least in part, on a comparison between the differential voltage and a reference voltage;
   identifying a value of the digital code word closest to a transition point of the comparison; and
   selecting the identified value of the digital code word as an indication of the captured value.

19. The method of claim 18, further comprising:
   moving a reference point of the differential voltage by coupling the first plate to the supply voltage and isolating the second plate from the supply voltage.

20. The method of claim 19, further comprising:
   maintaining a constant value of the differential voltage irrespective of voltage changes on either plate of the single capacitor.

* * * * *